United States Patent
Chang Chien et al.

(10) Patent No.: US 11,296,041 B2
(45) Date of Patent: Apr. 5, 2022

(54) INTEGRATED ANTENNA PACKAGE STRUCTURE AND MANUFACTURING METHOD THEREOF

(71) Applicant: Powertech Technology Inc., Hsinchu County (TW)

(72) Inventors: Shang-Yu Chang Chien, Hsinchu County (TW); Hung-Hsin Hsu, Hsinchu County (TW); Nan-Chun Lin, Hsinchu County (TW)

(73) Assignee: Powertech Technology Inc., Hsinchu County (TW)

(*) Notice: Subject to any disclaimer, the term of this patent is extended or adjusted under 35 U.S.C. 154(b) by 11 days.

(21) Appl. No.: 16/698,869

(22) Filed: Nov. 27, 2019

(65) Prior Publication Data

US 2020/0328167 A1    Oct. 15, 2020

Related U.S. Application Data

(60) Provisional application No. 62/831,730, filed on Apr. 10, 2019.

(51) Int. Cl.
*H01L 23/66* (2006.01)
*H01L 23/538* (2006.01)
(Continued)

(52) U.S. Cl.
CPC .......... *H01L 23/66* (2013.01); *H01L 21/4853* (2013.01); *H01L 21/4857* (2013.01);
(Continued)

(58) Field of Classification Search
CPC combination set(s) only.
See application file for complete search history.

(56) References Cited

U.S. PATENT DOCUMENTS 10,096,558 B1   10/2018   Chiang et al.
2014/0168014 A1   6/2014   Chih et al.
(Continued)

FOREIGN PATENT DOCUMENTS

CN   107452721   12/2017
CN   108511426   9/2018
(Continued)

OTHER PUBLICATIONS

"Office Action of Taiwan Counterpart Application", dated Sep. 14, 2020, p. 1-p. 8.
(Continued)

*Primary Examiner* — Moin M Rahman
(74) *Attorney, Agent, or Firm* — JCIPRNET

(57) ABSTRACT

An integrated antenna package structure including a chip package and an antenna device is provided. The antenna device is disposed on the chip package. The chip package includes a chip, an encapsulant, a circuit layer, and a conductive connector. The encapsulant at least directly covers the back side of the chip. The circuit layer is disposed under the encapsulant and electrically connected to the chip. The conductive connector penetrates the encapsulant and is electrically connected to the circuit layer. The antenna device includes a dielectric body, a coupling layer, and an antenna layer. The dielectric body has a first dielectric surface and a second dielectric surface opposite to the first dielectric surface. The coupling layer is disposed on the second dielectric surface of the dielectric body. The antenna layer is disposed on the first dielectric surface of the dielectric body. The antenna layer is electrically connected to the conductive connector. A manufacturing method of an integrated antenna package structure is also provided.

8 Claims, 35 Drawing Sheets

(51) Int. Cl.
*H01L 23/00* (2006.01)
*H01L 21/48* (2006.01)
*H01L 21/56* (2006.01)
*H01L 21/683* (2006.01)
*H01Q 1/22* (2006.01)
*H01L 23/31* (2006.01)
*H01L 25/10* (2006.01)
*H01L 25/00* (2006.01)
*H01L 21/78* (2006.01)
*H01L 23/552* (2006.01)

(52) U.S. Cl.
CPC .......... *H01L 21/561* (2013.01); *H01L 21/565* (2013.01); *H01L 21/568* (2013.01); *H01L 21/6835* (2013.01); *H01L 21/78* (2013.01); *H01L 23/3128* (2013.01); *H01L 23/5383* (2013.01); *H01L 23/5386* (2013.01); *H01L 23/5389* (2013.01); *H01L 23/552* (2013.01); *H01L 24/19* (2013.01); *H01L 24/20* (2013.01); *H01L 24/96* (2013.01); *H01L 25/105* (2013.01); *H01L 25/50* (2013.01); *H01Q 1/2283* (2013.01); *H01L 2221/68372* (2013.01); *H01L 2223/6677* (2013.01); *H01L 2224/214* (2013.01); *H01L 2224/95001* (2013.01); *H01L 2225/1035* (2013.01); *H01L 2225/1041* (2013.01); *H01L 2225/1058* (2013.01); *H01L 2924/3025* (2013.01); *H01L 2924/3511* (2013.01)

(56) References Cited

U.S. PATENT DOCUMENTS

| | | |
|---|---|---|
| 2016/0261036 A1 | 9/2016 | Sato et al. |
| 2017/0188458 A1* | 6/2017 | Hsieh ................ H05K 1/115 |
| 2018/0358312 A1 | 12/2018 | Yu et al. |
| 2018/0366347 A1* | 12/2018 | Chuang ............ H01L 21/561 |
| 2019/0051609 A1 | 2/2019 | Hsu et al. |
| 2019/0348756 A1* | 11/2019 | Liu .................... H01L 23/66 |
| 2020/0091095 A1* | 3/2020 | Jung ................ H01Q 21/0093 |

FOREIGN PATENT DOCUMENTS

| | | |
|---|---|---|
| TW | 201901864 | 1/2019 |
| TW | 201924010 | 6/2019 |

OTHER PUBLICATIONS

"Office Action of Taiwan Counterpart Application," dated Dec. 19, 2019, p. 1-p. 7.

"Office Action of China Counterpart Application", dated Oct. 19, 2021, p. 1-p. 10.

* cited by examiner

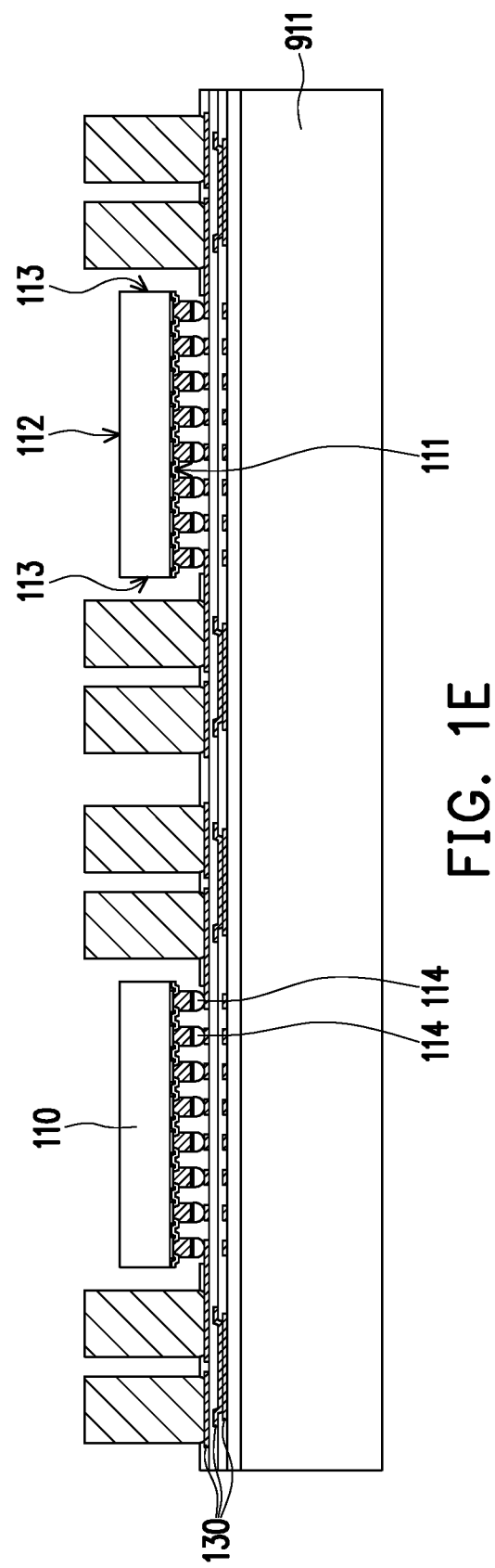

INTEGRATED ANTENNA PACKAGE STRUCTURE AND MANUFACTURING METHOD THEREOF

CROSS-REFERENCE TO RELATED APPLICATION

This application claims the priority benefit of U.S. provisional application Ser. No. 62/831,730, filed on Apr. 10, 2019. The entirety of the above-mentioned patent application is hereby incorporated by reference herein and made a part of this specification.

BACKGROUND

Technical Field

This invention relates to a package structure and a manufacturing method thereof, and in particular relates to an integrated antenna package structure and a manufacturing method thereof.

Description of Related Art

With the advancement of technology, the functions of electronic products are becoming more and more abundant. For example, in the current mobile communication device, in order to configure electronic components with different functions in one mobile communication device, the size of each electronic component is small for being possible to arrange all electronic components in the mobile communication device with the concept of light and thin.

The antenna in the existing electronic component is separated from the chip package structure, and the antenna needs to be electrically connected to the chip in the package structure by the circuit on the circuit board, so that the volume of the entire electronic component is difficult to be reduced.

SUMMARY

The invention provides an integrated antenna package structure and a manufacturing method thereof, which can have a smaller volume and a higher yield.

An integrated antenna package structure of the present invention comprises a chip package and an antenna device. The chip package comprises a chip, an encapsulant, a circuit layer, and a conductive connector. The encapsulant at least directly covers a back surface of the chip. The circuit layer is disposed under the encapsulant and electrically connected to the chip. The conductive connector penetrates through the encapsulant and is electrically connected to the circuit layer.

A manufacturing method of an integrated antenna package structure comprises the following steps: providing a carrier; forming a circuit layer on the carrier; forming a conductive connector on the circuit layer; disposing a chip on the circuit layer; forming an encapsulant on the circuit layer, wherein the encapsulant covers the chip and exposes the conductive connector; and disposing at least one antenna device on the encapsulant. Each of the at least one antenna device comprises a dielectric body, a coupling layer, and an antenna layer. The dielectric body has a first dielectric surface and a second dielectric surface opposite to the first dielectric surface. The coupling layer is disposed on the second dielectric surface of the dielectric body. The antenna layer is disposed on the first dielectric surface of the dielectric body, and the antenna layer is electrically connected to the conductive connector after the at least one antenna device is disposed on the encapsulant.

A manufacturing method of an integrated antenna package structure comprises the following steps: providing a first carrier; forming a circuit layer on the first carrier; forming a conductive connector on the circuit layer; disposing a chip on the circuit layer; forming an encapsulant on the circuit layer, wherein the encapsulant covers the chip and exposes the conductive connector; forming an antenna layer on the encapsulant; and forming at least a portion of a dielectric body and a coupling layer on the antenna layer.

Based on the above, an integrated antenna package structure and a manufacturing method thereof may have a smaller volume and a higher yield.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1A to FIG. 1I are schematic partial cross-sectional views of a partial manufacturing method of an integrated antenna package structure according to a first embodiment of the invention.

DESCRIPTION OF THE EMBODIMENTS

Figure 1A:
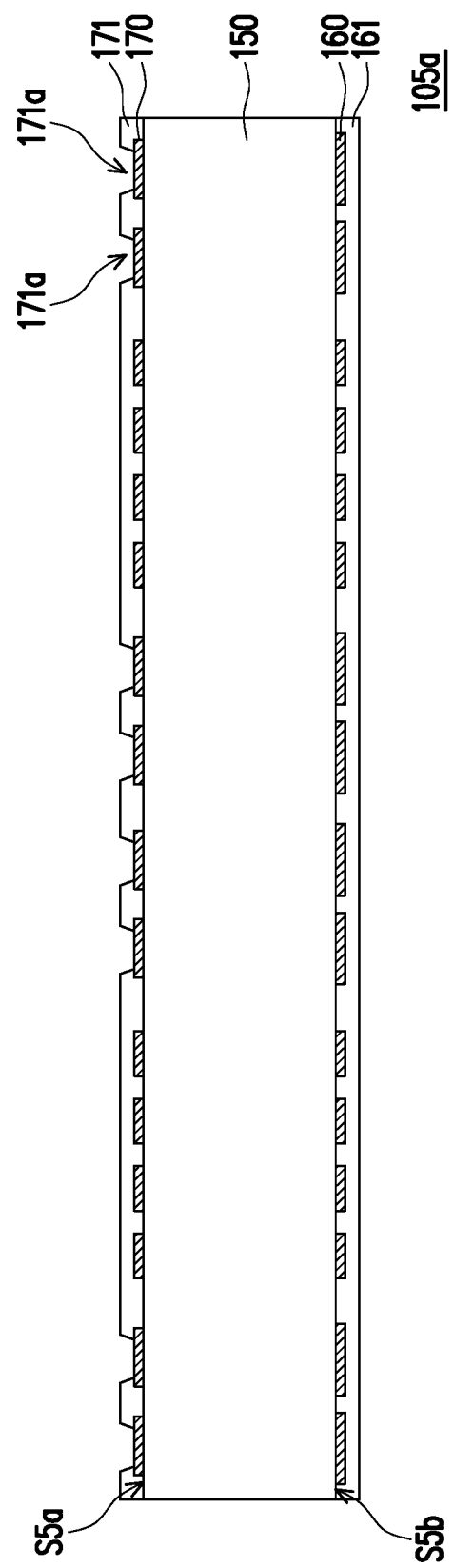

Herein, the directional terms (e.g., top, bottom, right, left, front, back, top, bottom) are merely used as a reference to the drawing and are not intended to imply the absolute orientation.

Unless otherwise expressly stated, any method described herein is not intended to be construed as performing its steps in a particular sequence.

The present invention will be described more fully with reference to the drawings of the embodiments. However, the invention may be embodied in various forms and should not be limited to the embodiments described herein. The thickness or size of layers or regions in the drawings may be exaggerated for clarity. The same or similar reference numbers indicate the same or similar elements, and the following paragraphs are not be iterated herein.

FIG. 1A to FIG. 1I are schematic partial cross-sectional views of a partial manufacturing method of an integrated antenna package structure according to a first embodiment of the invention. FIG. 1J is a schematic partial cross-sectional view of an integrated antenna package structure according to a first embodiment of the invention.

Referring to FIG. 1A, an antenna structure 105a is provided. The antenna structure 105a includes a dielectric body 150, a coupling layer 160, and an antenna layer 170. The dielectric body 150 has a first dielectric surface S5a and a second dielectric surface S5b opposite to the first dielectric surface S5a. The antenna layer 170 is disposed on the first dielectric surface S5a of the dielectric body 150. The coupling layer 160 is disposed on the second dielectric surface S5b of the dielectric body 150. The pattern of the antenna layer 170 and the pattern of the coupling layer 160 may be adjusted according to the design requirements, and are not limited in the present invention.

In the embodiment, a cover layer 161 may be formed on the coupling layer 160, but the invention is not limited thereto.

In the embodiment, an insulating layer 171 may be formed on the antenna layer 170. The insulating layer 171 at least covers a portion of the antenna layer 170. The insulating layer 171 may have a plurality of insulating openings 171a. The insulating opening 171a may expose a portion of the antenna layer 170.

The antenna layer 170, the coupling layer 160, the cover layer 161, the insulating layer 171, and the insulating opening 171a of the insulating layer 171 may be formed by a general semiconductor process (such as a deposition process, a lithography process, and/or an electroplating process), and thus will not be described herein.

In an embodiment, a corresponding film layer (e.g., the antenna layer 170) may be formed on the first dielectric surface S5a of the dielectric body 150, and then a corresponding film layer (e.g., the coupling layer 160) may be formed on the second dielectric surface S5b of the dielectric body 150.

In another embodiment, a corresponding film layer (e.g., the coupling layer 160) may be formed on the second dielectric surface S5b of the dielectric body 150, and then a corresponding film layer (e.g., the antenna layer 170) may be formed on the first dielectric surface S5a of the dielectric body 150.

In the embodiment, the antenna layer 170 may directly contact the first dielectric surface S5a of the dielectric body 150, and the coupling layer 160 may directly contact the second dielectric surface S5b of the dielectric body 150, but the invention is not limited thereto.

Figure 1B:
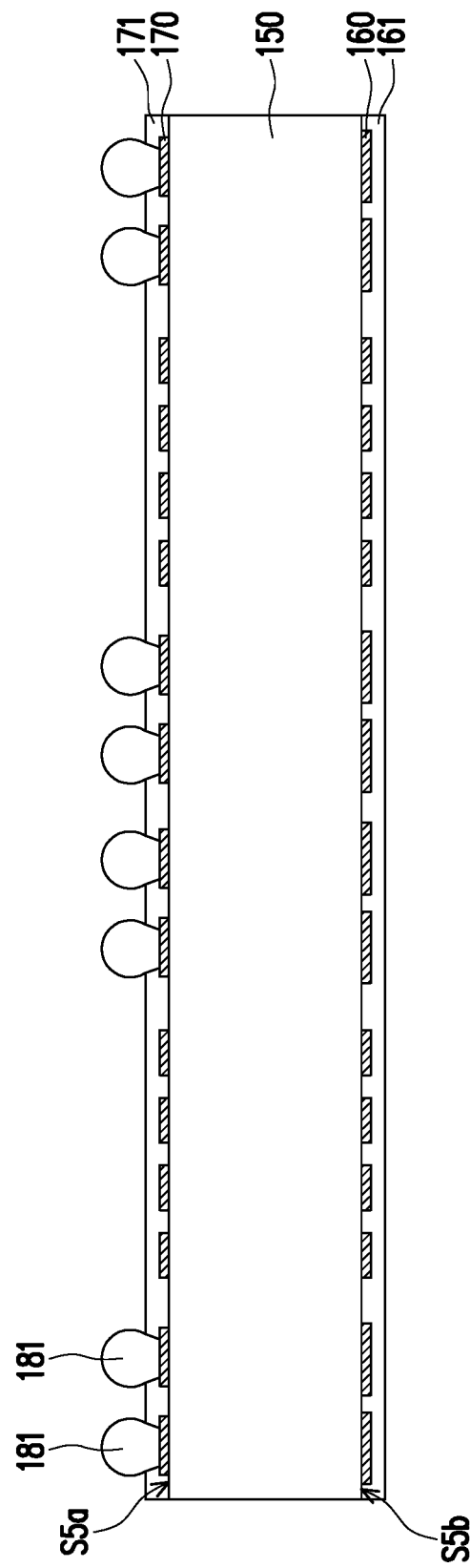

Referring to FIG. 1A to FIG. 1B, in the embodiment, the antenna structure 105a may further include a plurality of contact terminals 181. For example, a plurality of contact terminals 181 may be formed on the first dielectric surface S5a of the dielectric body 150. The contact terminal 181 may be embedded in the insulating opening 171a of the insulating layer 171. The contact terminal 181 may be electrically connected to the corresponding antenna layer 170.

In an embodiment, the contact terminal 181 is, for example, a solder ball, but the invention is not limited thereto. The forming process of the solder balls may include a reflow process.

Figure 1C:
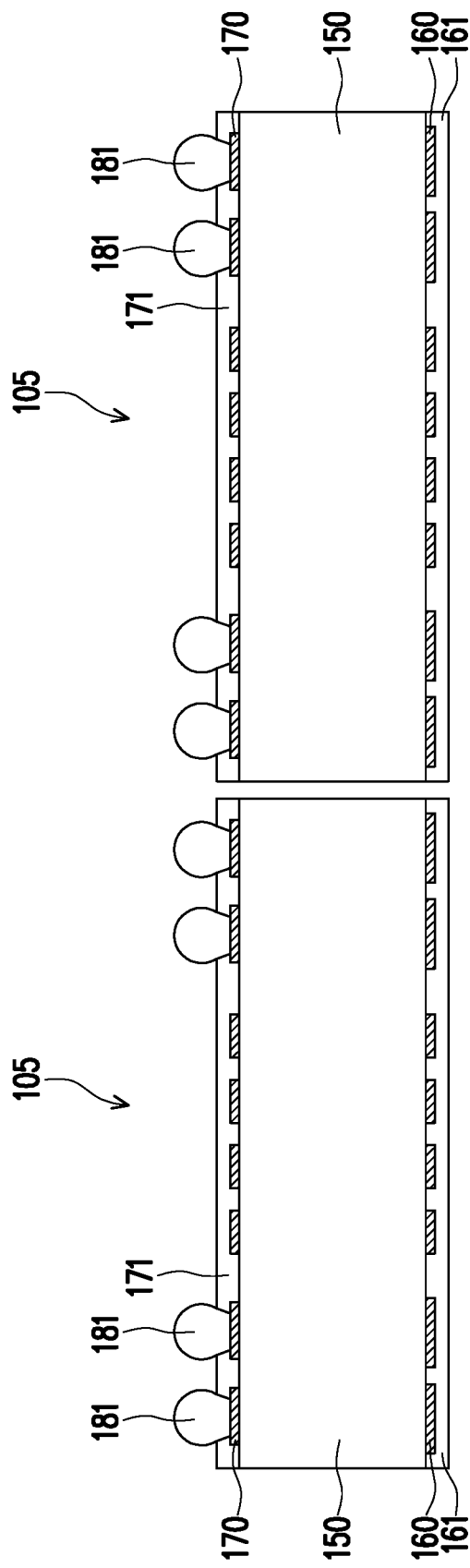

Referring to FIG. 1C, a singulation process or a dicing process may be performed to the antenna structure 105a for forming a plurality of antenna devices 105. The singulation process or the dicing process may include a cutting step performed to the dielectric body 150. The singulation process or the dicing process may include, for example, a rotating blade cutting step or a laser beam cutting step.

It should be noted that similar symbols will be used for the singulated components/structures after the singulation process or the dicing process. For example, the dielectric body 150 (labelled in FIG. 1A or FIG. 1B) may be a plurality of dielectric bodies 150 after the singulation process or the dicing process (labelled in FIG. 1C), the coupling layer 160 (labelled in FIG. 1A or FIG. 1B) may be a plurality of coupling layers 160 after the singulation process or the dicing process (labelled in FIG. 1C), the cover layer 161 (labelled in FIG. 1A or FIG. 1B) may be a plurality of cover layers 161 after the singulation process or the dicing process (labelled in FIG. 1C), the antenna layer 170 (labelled in FIG. 1A or FIG. 1B) may be a plurality of antenna layers 170 after the singulation process or the dicing process (labelled in FIG. 1C), the insulating layer 171 (labelled in FIG. 1A or FIG. 1B) may be a plurality of insulating layers 171 after the singulation process or the dicing process (labelled in FIG. 1C), and the like. Other singulated elements may be follow the same component symbol rules as described above and will not be described or specifically illustrated herein.

It should be noted that in the embodiment, after forming a plurality of contact terminals 181, a singulation process or a dicing process for forming the plurality of antenna devices 105 is performed. In an embodiment not shown, after performing a singulation process or a dicing process to the antenna structure 105a, a plurality of contact terminals 181 may be formed on the singulated device.

Figure 1D:
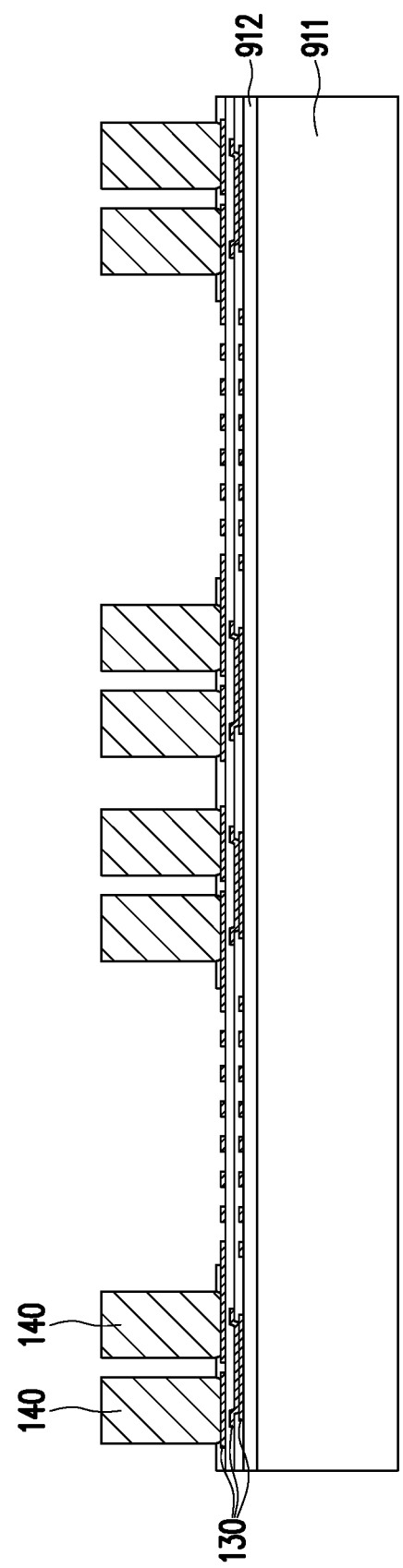

Referring to FIG. 1D, a first carrier 911 is provided. In the embodiment, the first carrier 911 is not particularly limited as long as the first carrier 911 can be adapted to be carried an element/device disposed thereon or a film layer disposed thereon.

In the embodiment, a release film 912 may be disposed on the first carrier 911. In a subsequent process, the release film 912 may make the first carrier 911 easier to separate from the component/device or film layer disposed thereon.

Referring to FIG. 1D, a circuit layer 130 is formed on the first carrier 911. The layout of the circuit layer 130 may be adjusted according to the design requirements, and is not limited in the present invention.

The circuit layer 130 may be formed by a general semiconductor process, and thus will not be described herein. In an embodiment, the circuit layer 130 may be referred to as a redistribution layer (RDL).

Referring to FIG. 1D, a conductive connector 140 is formed on the circuit layer 130. The conductive connector 140 is electrically connected to the corresponding circuit of the circuit layer 130.

In an embodiment, the conductive connector 140 may be formed, for example, by photolithography, deposition, and/or electroplating process, but the invention is not limited thereto. In another embodiment, the conductive connector 140 may be a preformed conductive post or a preformed conductive pillar.

Referring to FIG. 1E, a chip 110 is disposed on the circuit layer 130. The chip 110 may be a communication chip or a chip having a communication module.

The chip 110 has an active surface 111, a back surface 112, and a side surface 113. The back surface 112 is opposite the active surface 111. The side surface 113 connects the active surface 111 and the back surface 112. In the embodiment, the chip 110 may be configured such that its active surface 111 faces the circuit layer 130.

It should be noted that the order of forming/disposing the conductive connector 140 and disposing the chip 110 is not limited in the embodiment.

In the embodiment, the conductive connector 140 may be formed/disposed as illustrated in FIG. 1D, and the chip 110 may be disposed after forming/disposing the conductive connector 140 as illustrated in FIG. 1E.

In an embodiment not shown, the conductive connector 140 may be formed/disposed after disposing the chip 110.

In the embodiment, the chip 110 has a plurality of conductive bumps 114 on the active surface 111 thereof. The conductive bump 114 is, for example, a gold bump or a solder bump, but the invention is not limited thereto. The pads of the chip 110 may be electrically connected to the corresponding circuit of the circuit layer 130 by the corresponding conductive bump 114. That is, there may be a distance between the active surface 111 of the chip 110 and the circuit layer 130.

In the embodiment, the chip 110 is disposed thereon after the circuit layer 130 is formed. Therefore, the quality of the electrical connection between the circuit layer 130 and the chip 110 may be improved by the conductive bumps 114.

Figure 1F:
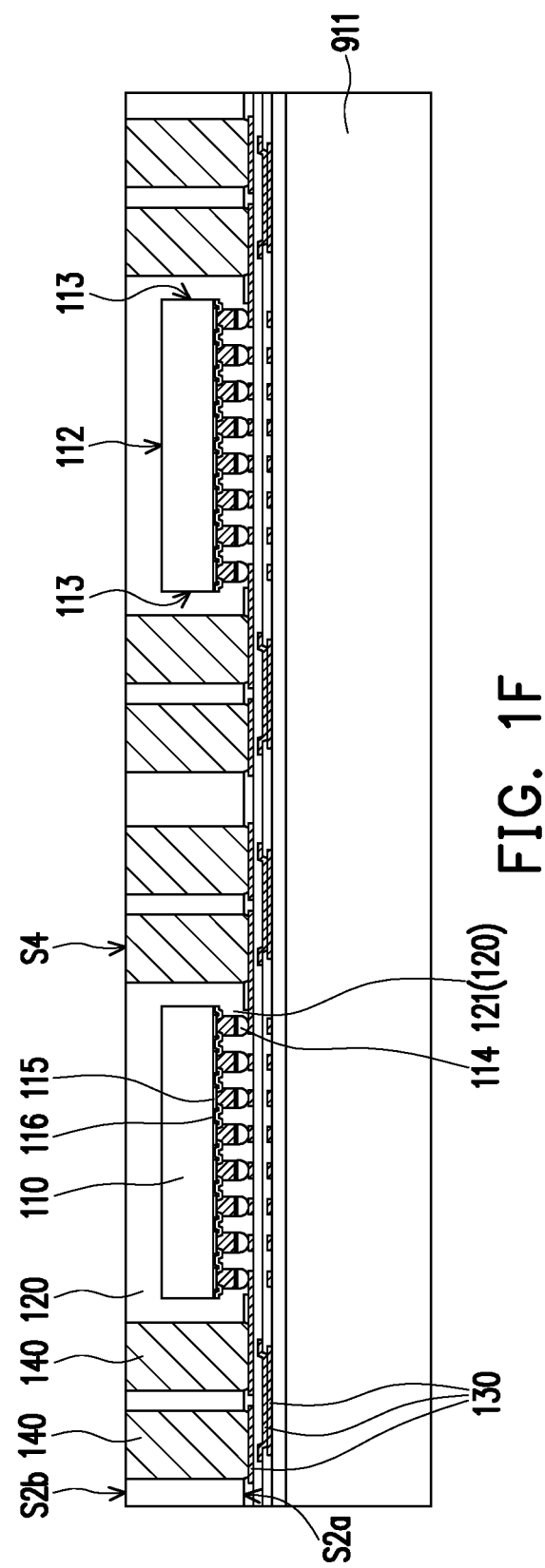

Referring to FIG. 1F, after the conductive connectors 140 and the chip 110 are formed/disposed, an encapsulant 120 is formed on the first carrier 911. The encapsulant 120 at least directly covers the back surface 112 of the chip 110, and the encapsulant 120 exposes the conductive connector 140.

The encapsulant 120 has a first encapsulant surface S2a and a second encapsulant surface S2b. The second encapsulant surface S2b is opposite to the first encapsulant surface S2a. The first encapsulant surface S2a of the encapsulant 120 faces the circuit layer 130.

For example, a molding material may be formed on the first carrier 911. Moreover, after the molding material is cured, a planarization process may be performed. After the planarization process, the encapsulant 120 may expose the conductive connectors 140. In other words, the second encapsulant surface S2b of the encapsulant 120 and the upper surface S4 of the conductive connector 140 (e.g., the surface of the conductive connector 140 that is furthest from the circuit layer 130) may be coplanar.

In the embodiment, the encapsulant 120 may completely cover the entire back surface 112 and the entire side surface 113 of the chip 110, but the invention is not limited thereto.

In the embodiment, a portion of the encapsulant 121 may be disposed between the chip 110 and the circuit layer 130, and a portion of the encapsulant 121 between the chip 110 and the circuit layer 130 may cover the conductive bumps 114. In other words, the first encapsulant surface S2a of the encapsulant 120 may not be coplanar with the active surface 111 of the chip 110, the contact pad 115 on the chip 110 (e.g., a die pad), and/or the passivation layer 116 on the chip 110, but the invention is not limited thereto.

Figure 1G:
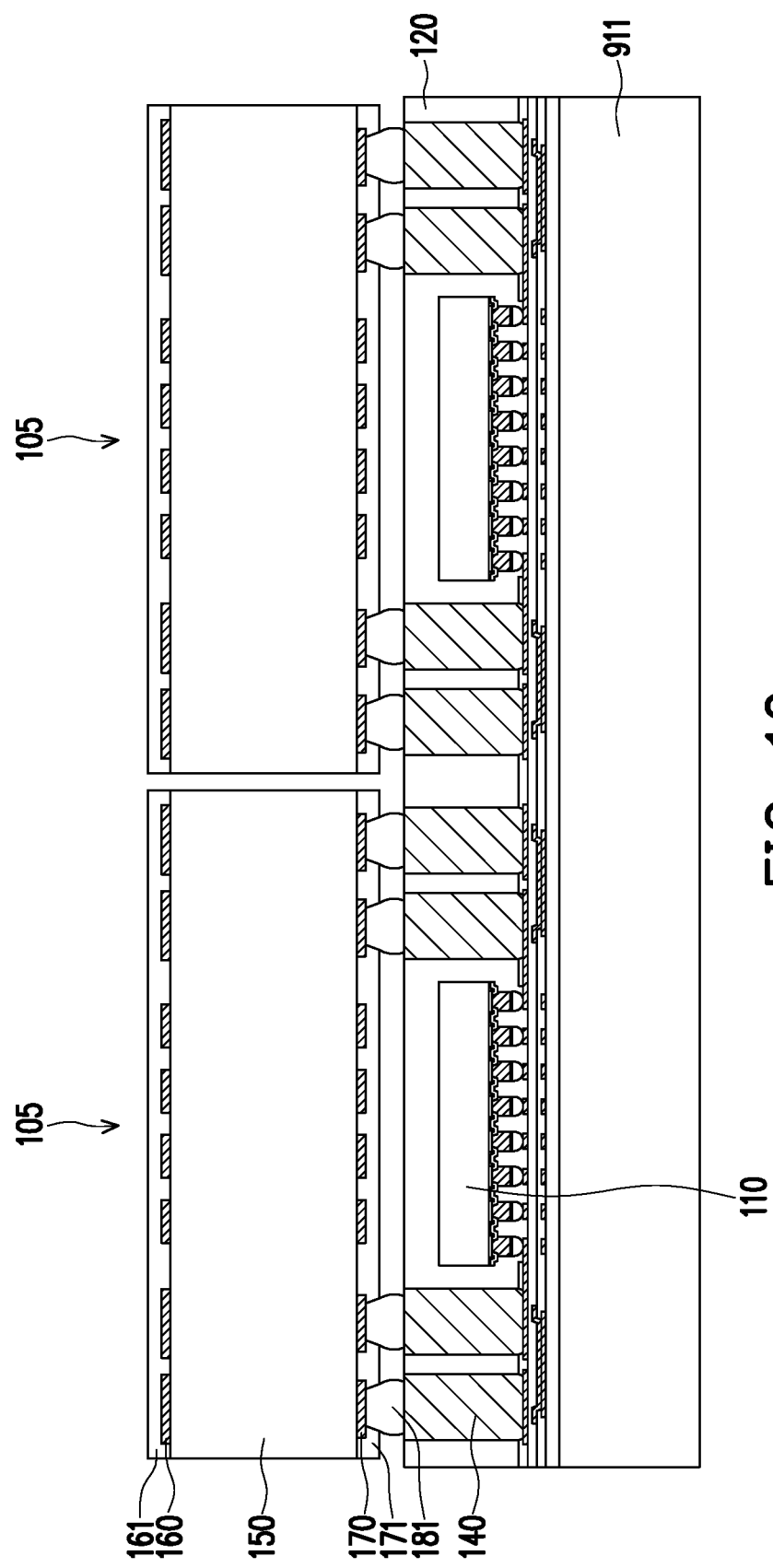

Referring to FIG. 1C and FIG. 1F to FIG. 1G, after the encapsulant 120 is formed, at least one antenna device 105 is disposed on the encapsulant 120. After the antenna device 105 is disposed on the encapsulant 120, the antenna layer 170 of the antenna device 105 may be electrically connected to the corresponding conductive connector 140.

For example, the antenna device 105 as shown in FIG. 1C may be turned upside down and disposed on the encapsulant 120. Then, the contact terminal 181 may be contacted to the conductive connector 140 by a reflow process. In this way, the antenna layer 170 of the antenna device 105 may be electrically connected to the corresponding conductive connector 140 by the corresponding contact terminal 181.

In the embodiment, the number of the antenna device(s) 105 disposed on the encapsulant 120 is not limited. For example, the number of antenna devices 105 disposed on the encapsulant 120 may correspond to the number of chips 110.

Figure 1H:
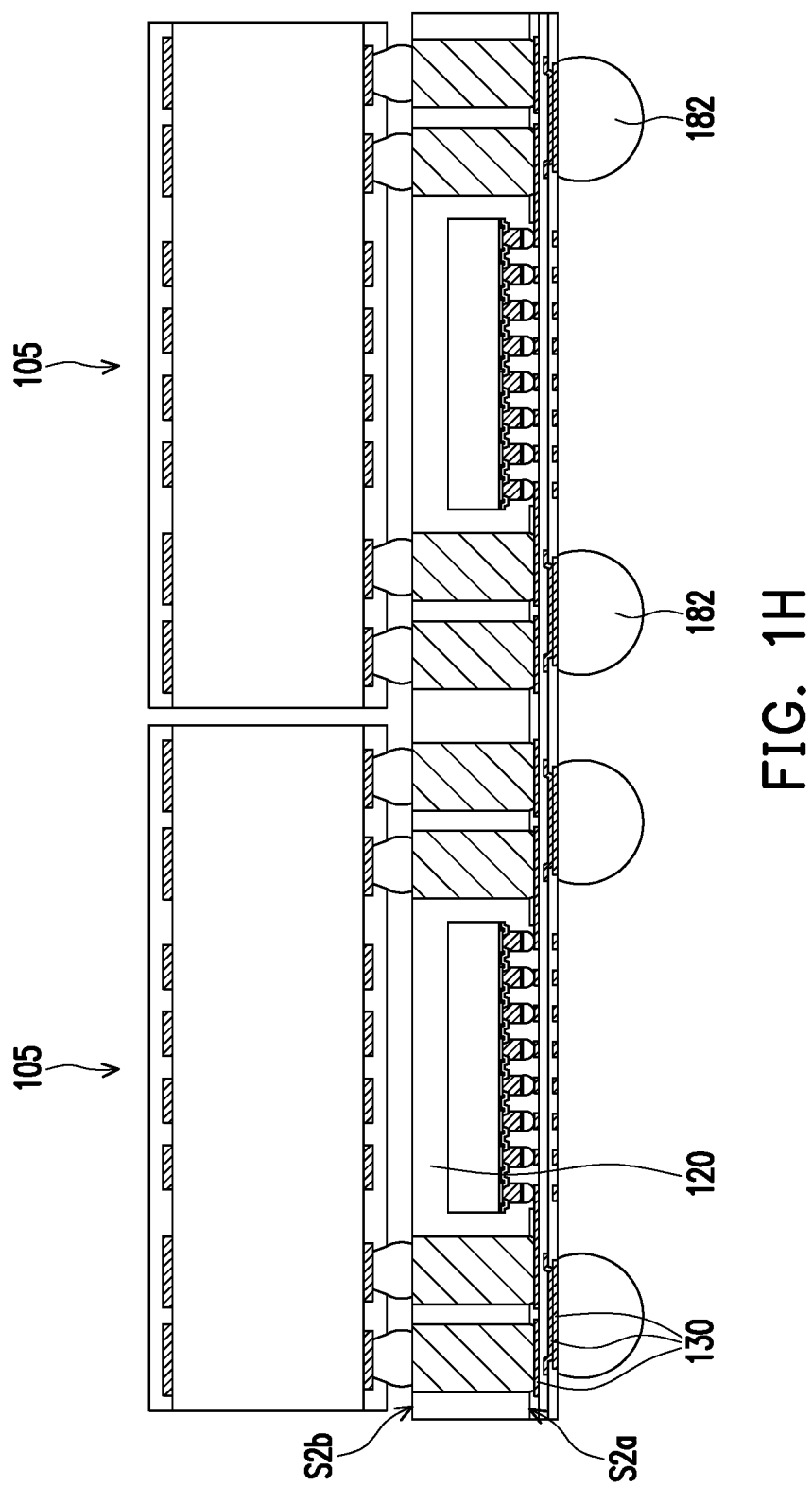

Referring to FIG. 1G to FIG. 1H, in the embodiment, after the antenna device 105 is disposed on the encapsulant 120, the first carrier 911 may be removed.

In the embodiment, after the first carrier 911 is removed, a plurality of conductive terminals 182 may be formed. The conductive terminal 182 is disposed on the first encapsulant surface S2a of the encapsulant 120, and the conductive terminal 182 is electrically connected to the corresponding circuit of the circuit layer 130. The conductive terminal 182 may be electrically connected to the chip 110 by the corresponding circuit of the circuit layer 130.

In an embodiment, the conductive terminal 182 is, for example, a solder ball, but the invention is not limited thereto.

Figure 1I:
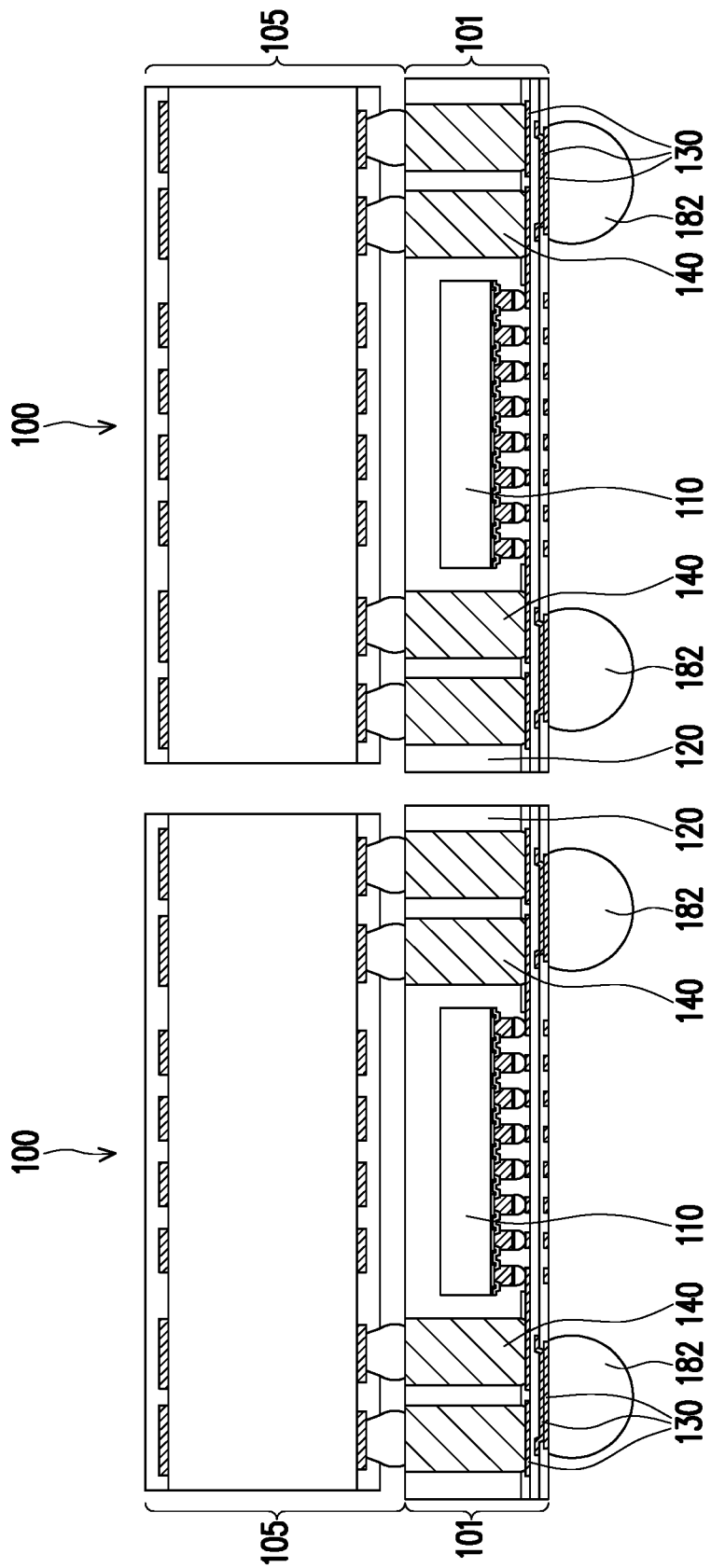
Figure 1J:
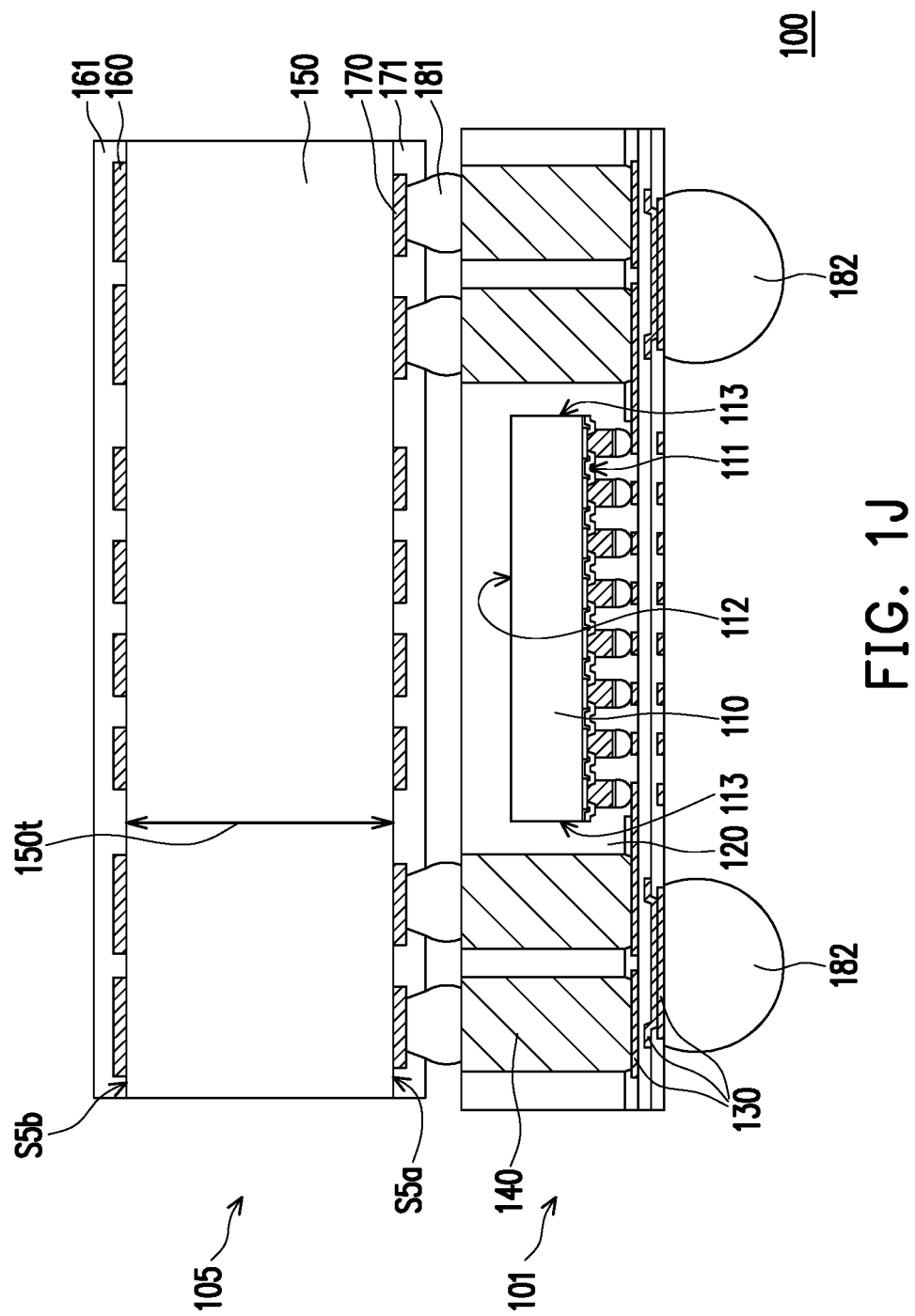
FIG. 1J is a schematic partial cross-sectional view of an integrated antenna package structure according to a first embodiment of the invention.

Referring to FIG. 1I, a singulation process or a dicing process may be performed to the structure as illustrated in FIG. 1H for forming a plurality of integrated antenna package structures 100. The singulation process or the dicing process may include a cutting step performed to the encapsulant 120.

It should be noted that similar symbols will be used for the singulated components/structures after the singulation process or the dicing process. For example, the plurality of antenna devices 105 (labelled in FIG. 1H) may be a plurality of antenna devices 105 after the singulation process or the dicing process (labelled in FIG. 1I), the plurality of chips 110 (labelled in FIG. 1H) may be a plurality of chips 110 after the singulation process or the dicing process (labelled in FIG. 1I), the encapsulant 120 (labelled in FIG. 1H) may be a plurality of encapsulants 120 after the singulation process or the dicing process (labelled in FIG. 1I), the circuit layer 130 (labelled in FIG. 1H) may be a plurality of circuit layers 130 after the singulation process or the dicing process (labelled in FIG. 1I), the plurality of conductive connectors 140 (labelled in FIG. 1H) may be a plurality of conductive connectors 140 after the singulation process or the dicing process (labelled in FIG. 1I), and the like. Other singulated elements may be follow the same component symbol rules as described above and will not be described or specifically illustrated herein.

The chip 110, the encapsulant 120, the circuit layer 130, and the conductive connectors 140 after the singulation process or the dicing process may constitute a chip package 101. That is, after the singulation process or the dicing process is performed, a plurality of chip packages 101 may be formed. In other words, each of the chip packages 101 may include the corresponding chip 110, the corresponding encapsulant 120, the corresponding circuit layer 130, and the corresponding conductive connectors 140.

It should be noted that in the embodiment, after removing the first carrier 911, the singulation process or the dicing process for forming the plurality of chip packages 101 is performed. In an embodiment not shown, after performing a singulation process or a dicing process on the structure disposed on the first carrier 911, the first carrier 911 is removed to form a plurality of chip packages 101.

It should be noted that in the embodiment, after forming a plurality of conductive terminals 182, a singulation process or a dicing process for forming the plurality of chip packages 105 is performed. In an embodiment not shown, after performing a singulation process or a dicing process for forming the plurality of chip packages 101, a plurality of conductive terminals 182 may be formed on the chip package 101.

After the above manufacturing process is performed, an integrated antenna package structure 100 provided in the present embodiment is substantially formed. Referring to FIG. 1J, the integrated antenna package structure 100 includes a chip package 101 and an antenna device 105. The antenna device 105 is disposed on the chip package 101. The chip packages 101 includes a chip 110, an encapsulant 120, a circuit layer 130, and a conductive connector 140. The encapsulant 120 at least directly covers the back surface 112 of the chip 110. The circuit layer 130 is disposed under the encapsulant 120. A corresponding circuit of the circuit layer 130 is electrically connected to the chip 110. The conductive connector 140 penetrates through the encapsulant 120. The conductive connector 140 is electrically connected to a corresponding circuit of the circuit layers 130. The antenna device 105 includes a dielectric body 150. The dielectric body 150 has a first dielectric surface S5a and a second dielectric surface S5b. The second dielectric surface S5b is opposite to the first dielectric surface S5a. The coupling layer 160 is disposed on the second dielectric surface S5b of the dielectric body 150. The antenna layer 170 is disposed on the first dielectric surface S5a of the dielectric body 150. The antenna layer 170 is electrically connected to the conductive connector 140. The chip 110 may be electrically connected to the corresponding antenna layer 170 by a corresponding circuit of the circuit layer 130, a corresponding conductive connector 140, and a corresponding contact terminal 181.

In the embodiment, the dielectric body 150 is not completely removed during the manufacturing process of the integrated antenna package structure 100. Therefore, in the manufacturing method of the integrated antenna package structure 100, the dielectric body 150 may need to have good supportability, physical stability, and chemical stability. For example, in a common deposition process or reflow process, there may be a corresponding heating or cooling step; in a common lithography process or electroplating process, a corresponding acid, base or solvent may be used. Therefore, the material of the dielectric body 150 may be an inorganic material having a relatively stable physical property or chemical property, but the invention is not limited thereto.

In the embodiment, the dielectric body 150 may be a plate-shaped body, and the thickness 150t of the dielectric body 150 may be greater than 100 micrometers (μm). In other words, the dielectric substrate 150 may not be a film layer formed by evaporation, sputtering, deposition or coating process.

In an embodiment, the dielectric substrate 150 may be a homogeneous material, and the aforementioned homogeneous material can no longer be separated into different single materials by mechanical methods such as crushing, shearing, cutting, sawing, grinding, and the like. In other words, there may be no interface formed by different materials or different processes in the dielectric body 150.

In an embodiment, the material of the dielectric body 150 may include a silicate material. For example, the dielectric body 150 may be a glass substrate, a ceramic substrate, or a quartz substrate.

In the embodiment, there may be no conductive material between the coupling layer 160 and the antenna layer 170, and the coupling layer 160 at least partially overlaps the antenna layer 170.

In the embodiment, the coupling layer 160 and the antenna layer 170 are electrically insulated or physically insulated, and the coupling layer 160 is electrically coupled to the antenna layer 170. That is, there is no direct contact between the coupling layer 160 and the antenna layer 170. The coupling layer 160 and the antenna layer 170 may be coupled by means of induction (e.g., electromagnetic induction).

In the embodiment, there may be an air gap between the chip package 101 and the antenna device 105, but the invention is not limited thereto.

Figure 2:
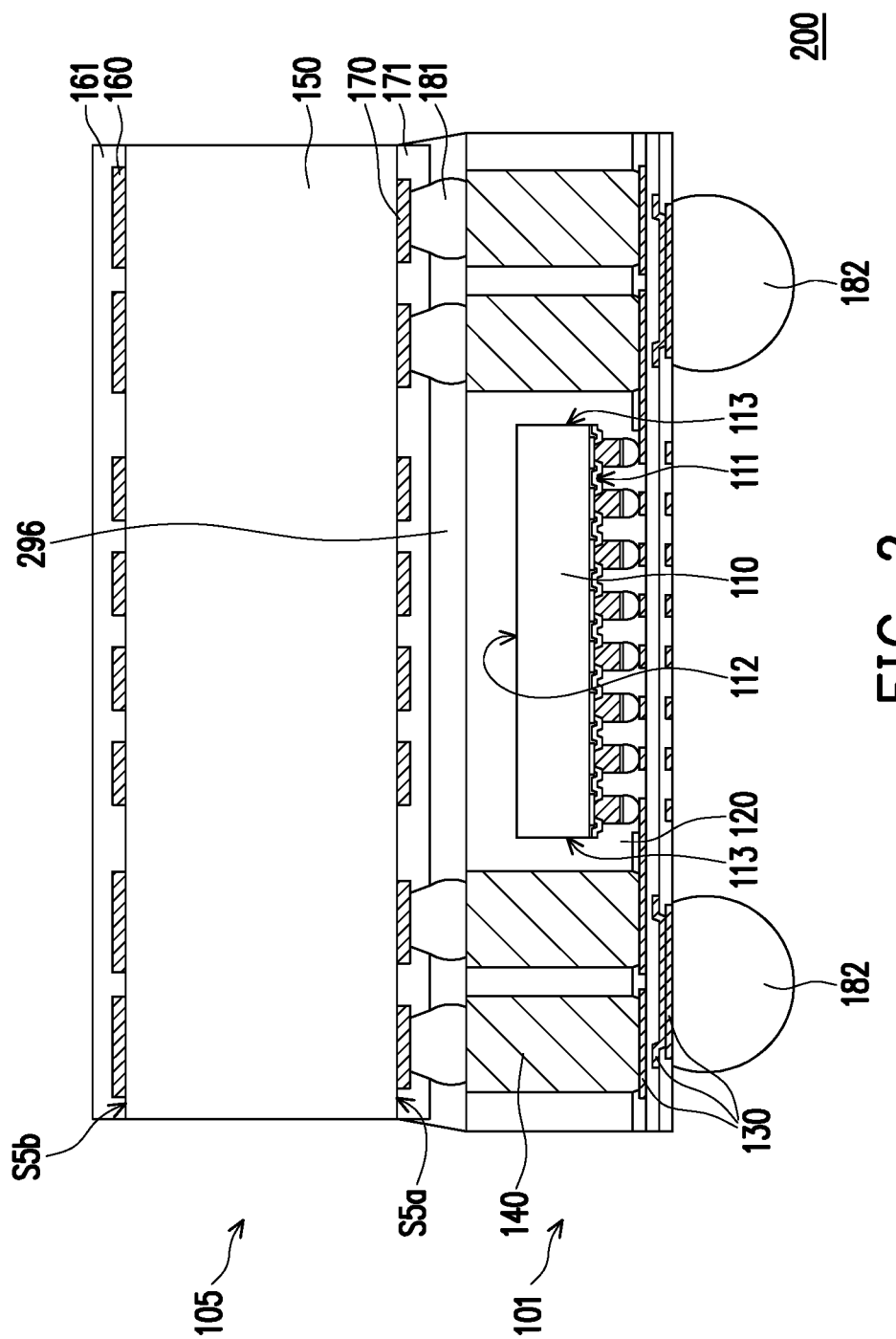
FIG. 2 is a schematic partial cross-sectional view of an integrated antenna package structure according to a second embodiment of the invention.

FIG. 2 is a schematic partial cross-sectional view of an integrated antenna package structure according to a second embodiment of the invention. In the embodiment, the manufacturing method of the integrated antenna package structure 200 of the present embodiment is similar to the manufacturing method of the integrated antenna package structure 100 of the first embodiment, and similar elements are denoted by the same reference numerals, and have similar functions, materials, or formation modes, and the description is omitted.

In the embodiment, a filling layer 296 may be disposed between the chip package 101 and the antenna device 105. The filling layer 296 is, for example, a capillary underfill (CUF) or other suitable filling material, which is not limited in the invention.

FIG. 3A to FIG. 3F are schematic partial cross-sectional views of a partial manufacturing method of an integrated antenna package structure according to a third embodiment of the invention. FIG. 3G is a schematic partial cross-sectional view of an integrated antenna package structure according to a third embodiment of the invention. In the embodiment, the manufacturing method of the integrated antenna package structure 300 of the present embodiment is similar to the manufacturing method of the integrated antenna package structure 100 of the first embodiment, and similar elements are denoted by the same reference numerals, and have similar functions, materials, or formation modes, and the description is omitted.

Figure 3A:
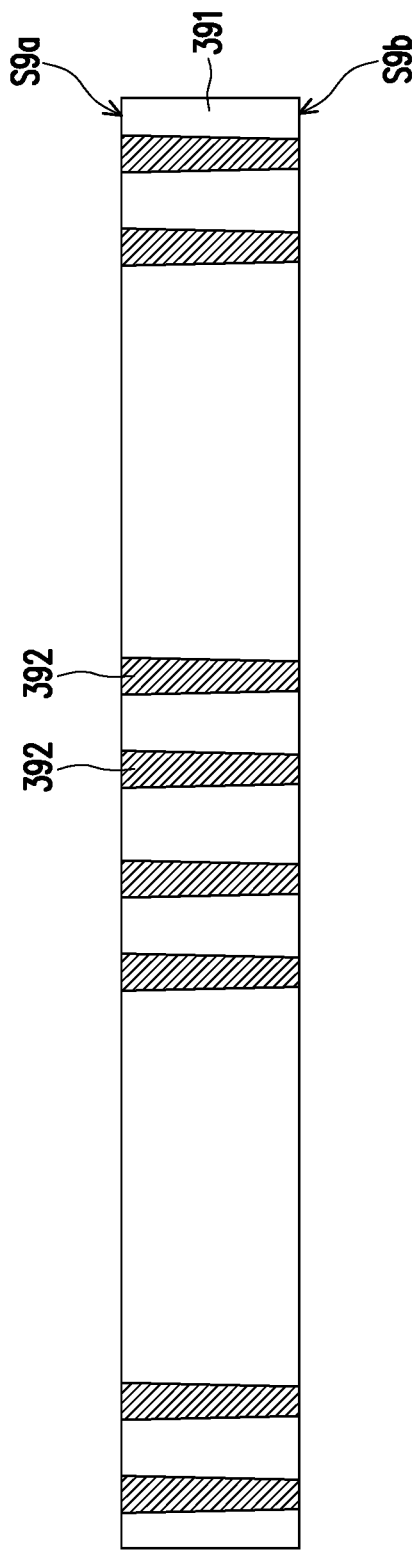
FIG. 3A to FIG. 3F are schematic partial cross-sectional views of a partial manufacturing method of an integrated antenna package structure according to a third embodiment of the invention.
Figure 3B:
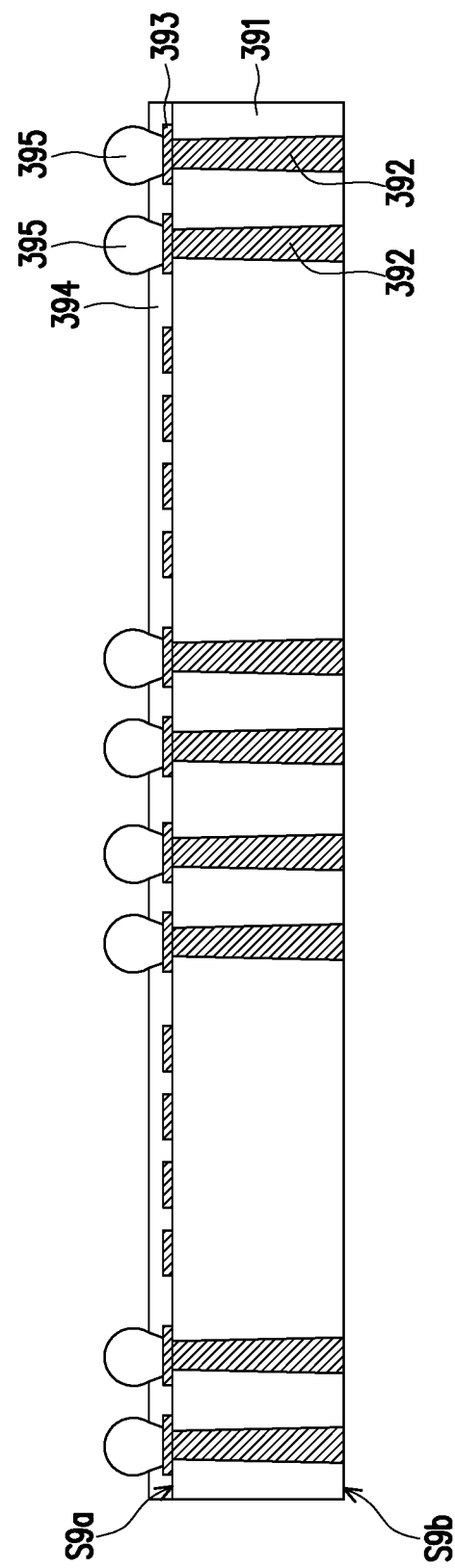
Figure 3C:
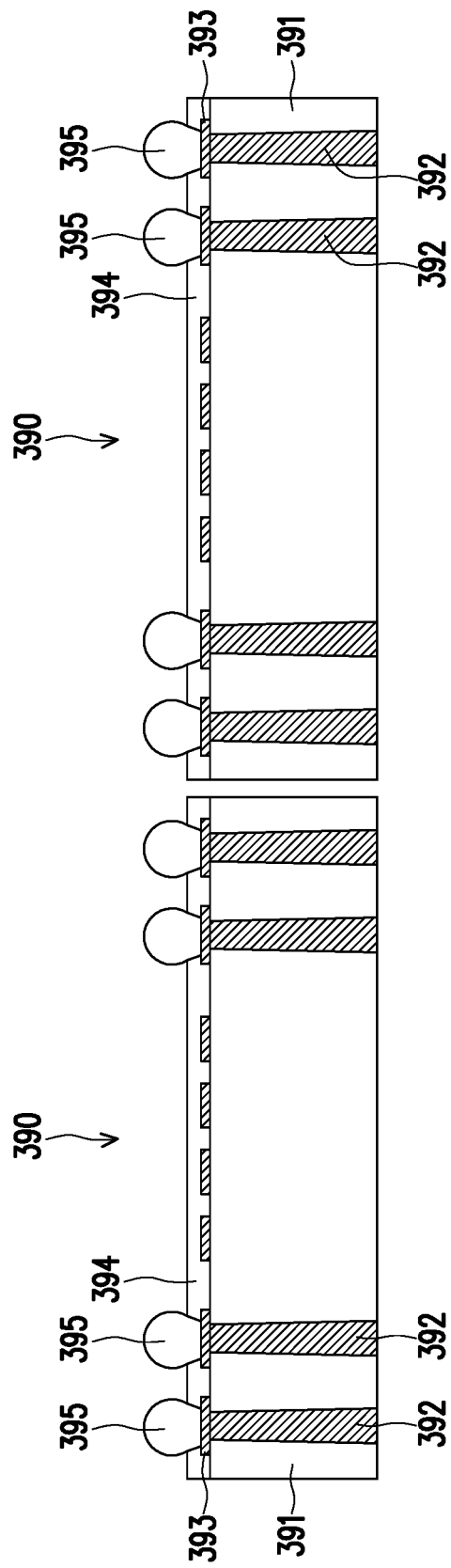

Referring to FIG. 3A to FIG. 3C, a partial manufacturing method of an interposer 390 (shown in FIG. 3C) may include, for example, the following steps.

Referring to FIG. 3A, a dielectric substrate 391 is provided. The dielectric substrate 391 has a first substrate surface S9a and a second substrate surface S9b. The second substrate surface S9b is opposite to the first substrate surface S9a.

In the embodiment, the dielectric substrate 391 is not particularly limited as long as the dielectric substrate 391 can be adapted to be carried an element/device disposed thereon or a film layer disposed thereon, and can be stably present in a temperature or temperature difference in a subsequent process.

In an embodiment, the material or size of the dielectric substrate 391 may be the same or similar to the material or size of the aforementioned dielectric body 150, but the invention is not limited thereto.

Referring to FIG. 3A, a plurality of conductive vias 392 penetrating the dielectric substrate 391 are formed. The conductive vias 392 may be formed by a general semiconductor process, and thus will not be described herein.

In an embodiment, the conductive via 392 may be referred to as a through glass via (TGV), but the invention is not limited thereto. In an embodiment not shown, the conductive via 392 may be referred to as a plating through hole (PTH).

Referring to FIG. 3A to FIG. 3B, a circuit layer 393 is formed on the first substrate surface S9$a$ of the dielectric substrate 391. The conductive via 392 is electrically connected to the corresponding circuit of the circuit layer 393. The circuit layer 393 may be formed by evaporation, sputtering, deposition, screen printing or other suitable process, and is not limited in the invention. In addition, the layout of the circuit layer 393 may be adjusted according to the design requirements, and is not limited in the present invention.

In an embodiment not shown, the conductive via 392 and the conductive film layer closest to the first substrate surface S9$a$ (which may be a part of the circuit layer 393) may be formed by the same or similar steps.

Referring to FIG. 3B, in the embodiment, an insulating layer 394 may be formed on the circuit layer 393. The insulating layer 394 at least covers a portion of the circuit layer 393. The insulating layer 394 may have a plurality of insulating openings (not labeled). The insulating opening may expose a portion of the circuit layer 393. The insulating layer 394 and the insulating openings thereof may be formed by a general semiconductor process (such as a deposition process, a lithography process, and/or an electroplating process), and thus will not be described herein.

Referring to FIG. 3B, in the embodiment, a plurality of contact terminals 395 may be formed on the first substrate surface S9$a$ of the dielectric substrate 391. The contact terminal 395 may be embedded in the insulating opening of the insulating layer 394. The contact terminal 395 is electrically connected to the corresponding circuit of the circuit layer 393.

In an embodiment, the contact terminal 395 is, for example, a solder ball, but the invention is not limited thereto. The forming process of the solder balls may include a reflow process.

Referring to FIG. 3B to FIG. 3C, a singulation process or a dicing process may be performed to the structure as illustrated in FIG. 3B for forming a plurality of interposers 390. The singulation process or the dicing process may include a cutting step performed to the dielectric substrate 391. The singulation process or the dicing process may include, for example, a rotating blade cutting step or a laser beam cutting step.

It should be noted that similar symbols will be used for the singulated components/structures after the singulation process or the dicing process. For example, the dielectric substrate 391 (labelled in FIG. 3B) may be a plurality of dielectric substrates 391 after the singulation process or the dicing process (labelled in FIG. 3C), the circuit layer 393 (labelled in FIG. 3B) may be a plurality of circuit layers 393 after the singulation process or the dicing process (labelled in FIG. 3C), the insulating layer 394 (labelled in FIG. 3B) may be a plurality of insulating layers 394 after the singulation process or the dicing process (labelled in FIG. 3C), the plurality of contact terminals 395 (labelled in FIG. 3B) may be a plurality of contact terminals 395 after the singulation process or the dicing process (labelled in FIG. 3C), and the like. Other singulated elements may be follow the same component symbol rules as described above and will not be described or specifically illustrated herein.

It should be noted that in the embodiment, after forming a plurality of contact terminals 395, a singulation process or a dicing process for forming the plurality of interposers 390 is performed. In an embodiment not shown, after performing a singulation process or a dicing process, a plurality of contact terminals 395 may be formed on the singulated device.

Referring to FIG. 1C, FIG. 1F, and FIG. 3C to FIG. 3D, after the encapsulant 120 is formed, at least one interposer 390 and at least one antenna device 105 are disposed on the encapsulant 120, and the interposer 390 is disposed between the antenna device 105 and the encapsulant 120. After the interposer 390 and the antenna device 105 are disposed on the encapsulant 120, the antenna layer 170 of the antenna device 105 may be electrically connected to the corresponding conductive connector 140 by the interposer 390.

In the embodiment, the interposer 390 and the antenna device 105 are arranged in a one-to-one manner, but the invention is not limited thereto.

Figure 3D:
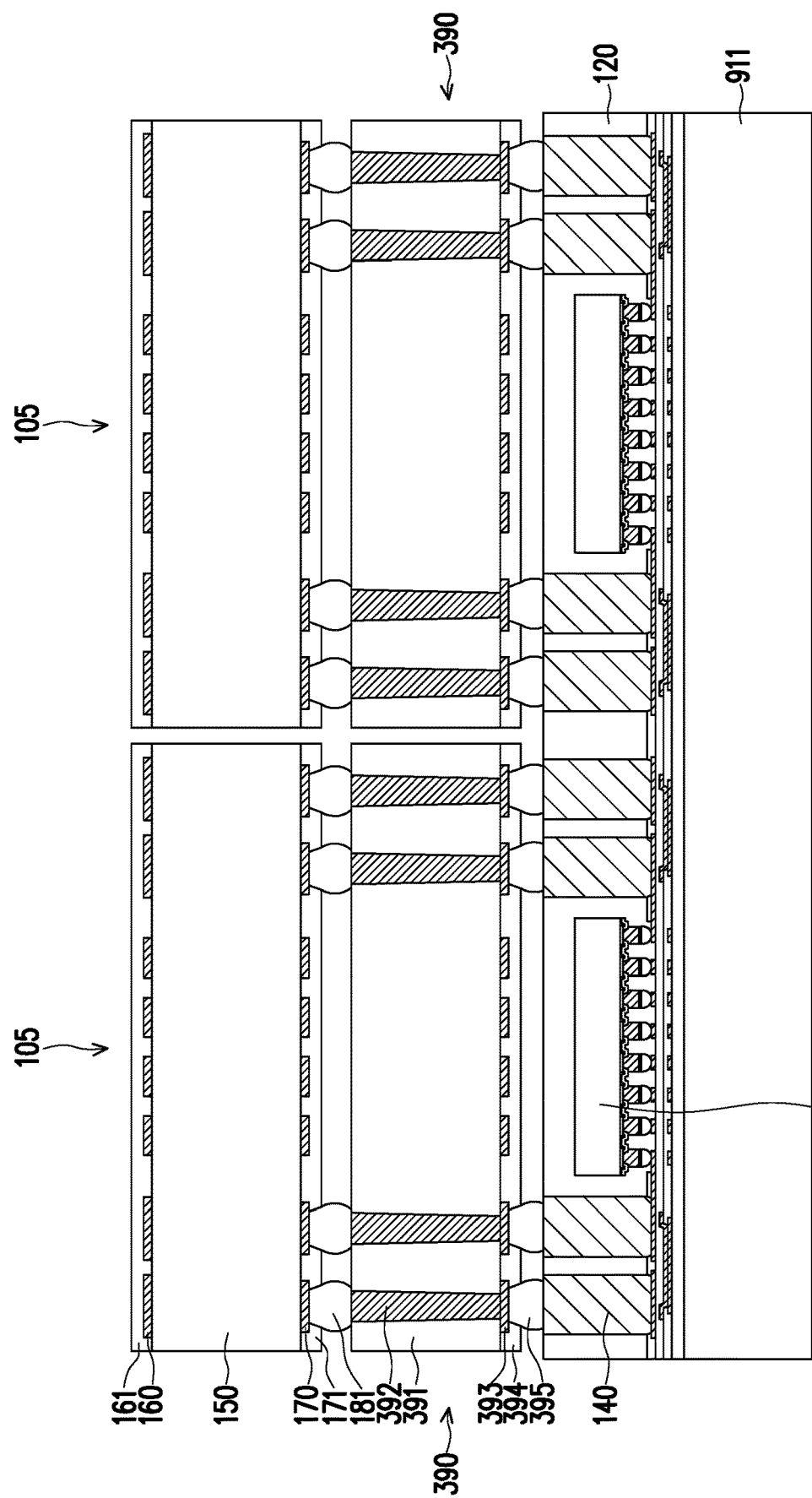
Figure 3E:
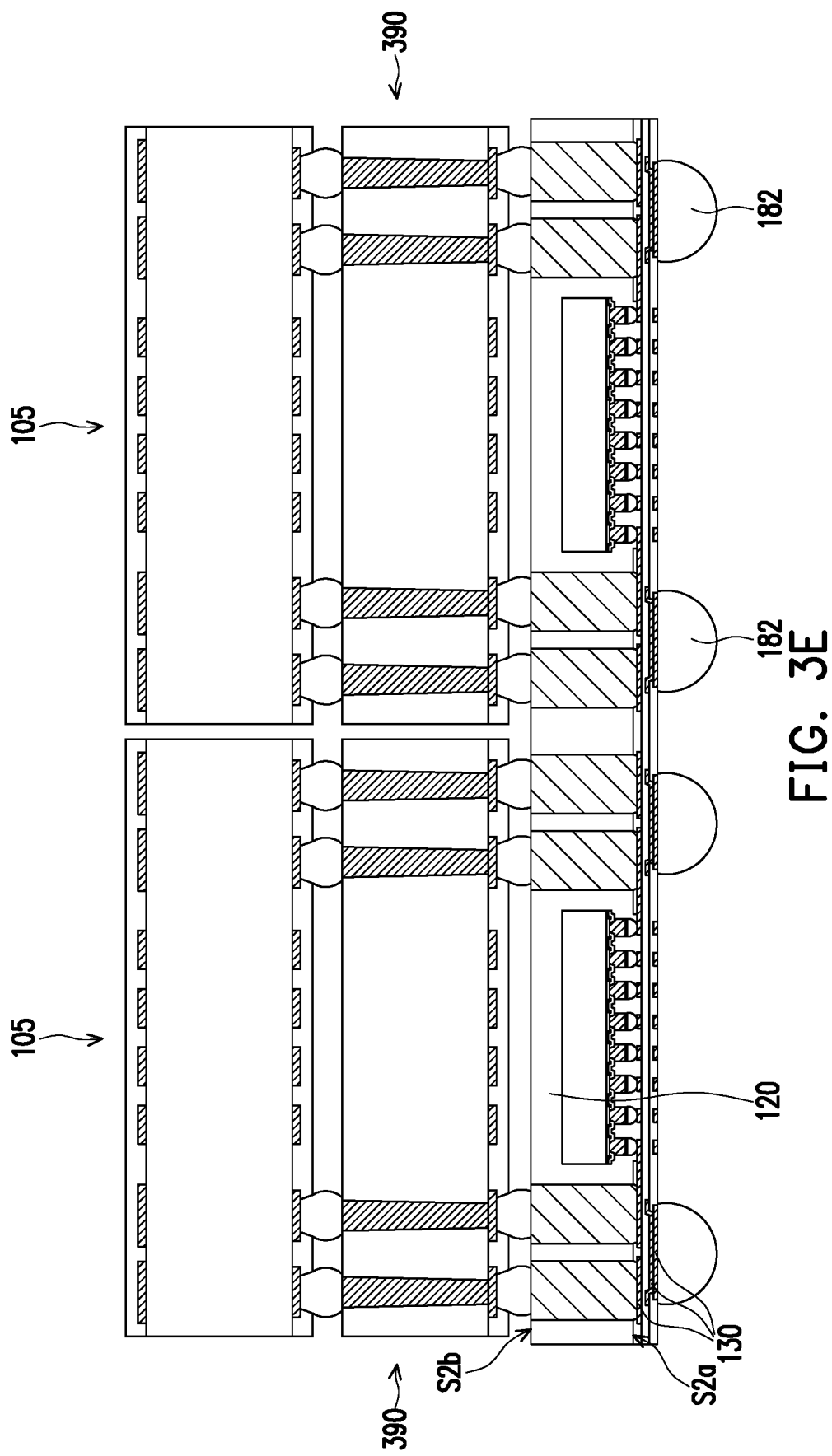

Referring to FIG. 3D to FIG. 3E, in the embodiment, after the interposer 390 and the antenna device 105 are disposed on the encapsulant 120, the first carrier 911 may be removed.

In the embodiment, after the first carrier 911 is removed, a plurality of conductive terminals 182 may be formed. The conductive terminal 182 may be electrically connected to the interposer 390 by the corresponding circuit of the circuit layer 130.

Figure 3F:
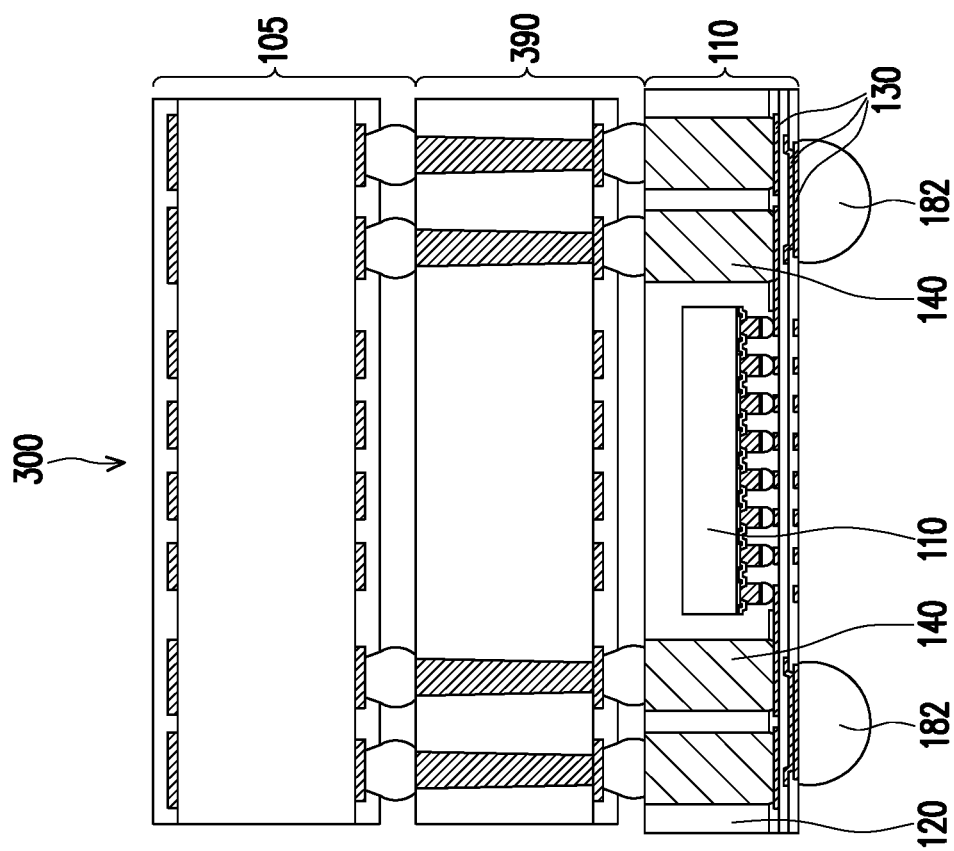
Figure 3F:
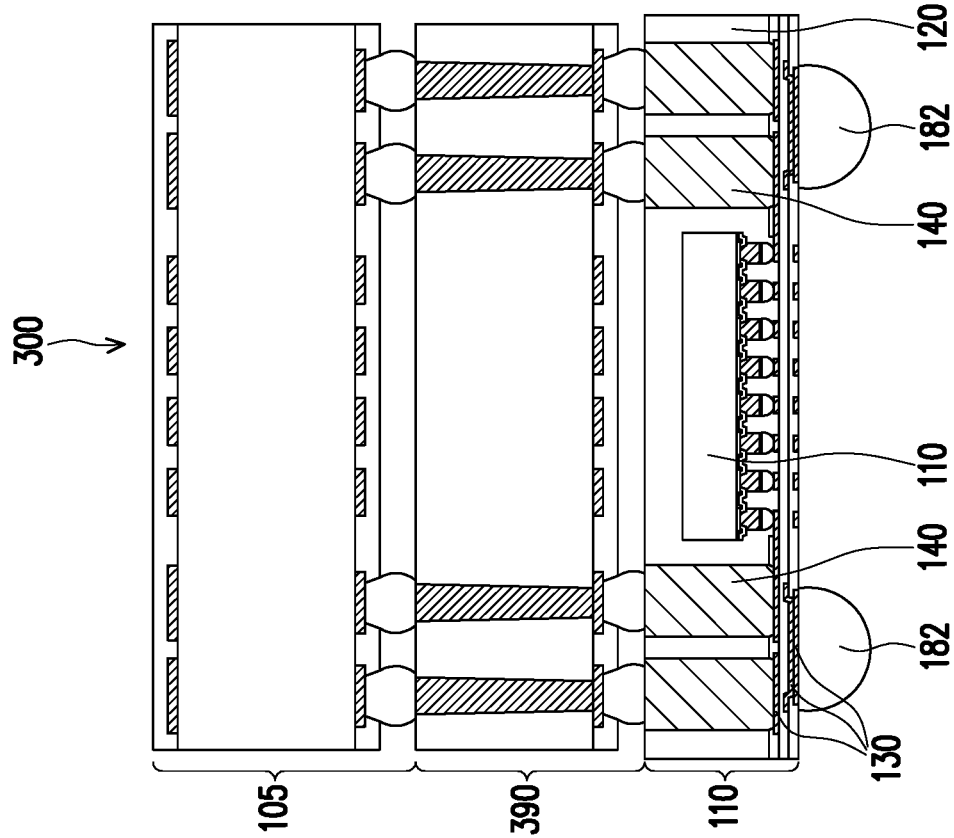
Figure 3G:
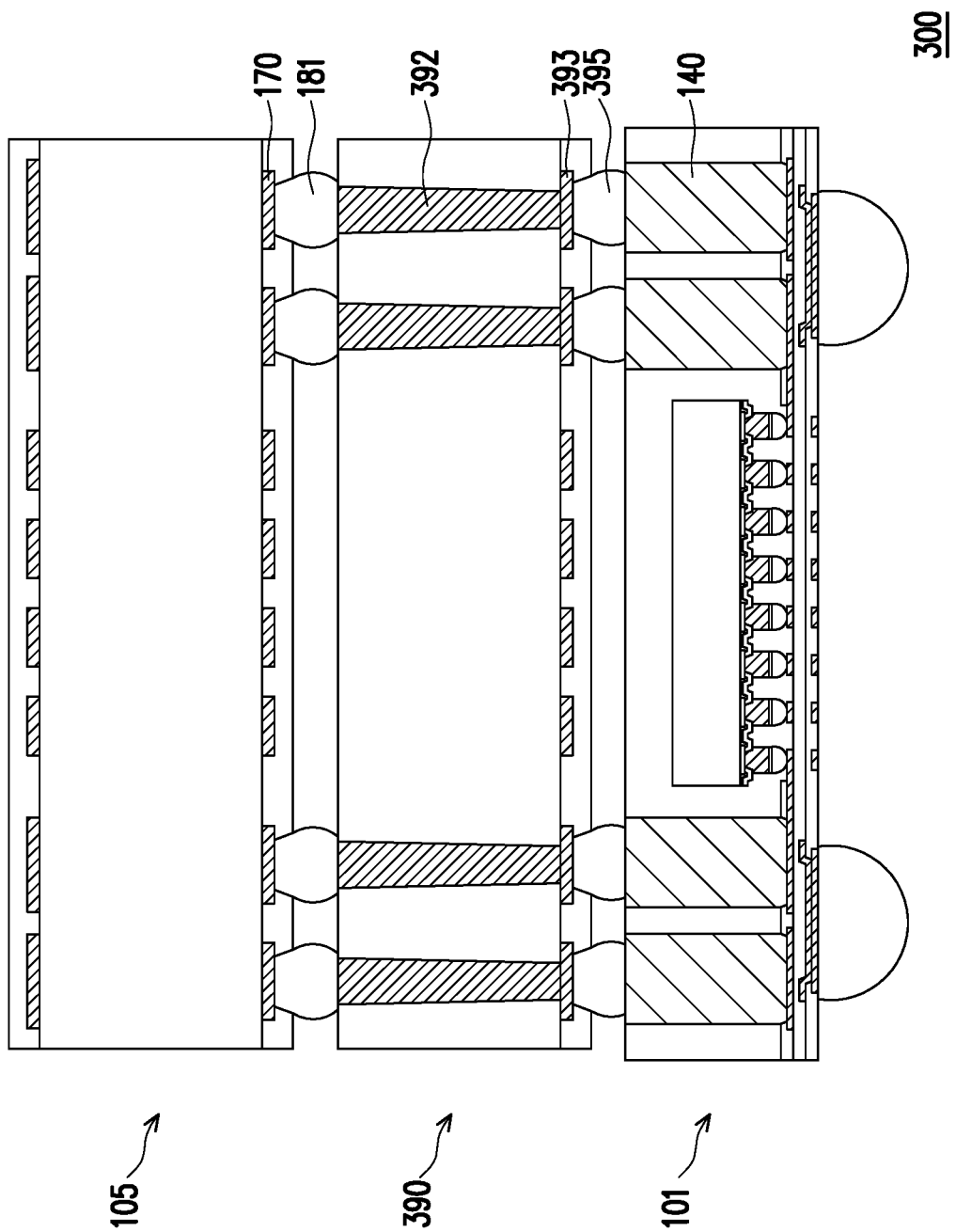
FIG. 3G is a schematic partial cross-sectional view of an integrated antenna package structure according to a third embodiment of the invention.

Referring to FIG. 3F, a singulation process or a dicing process may be performed to the structure as illustrated in FIG. 3E for forming a plurality of integrated antenna package structure 300. The singulation process or the dicing process may include a cutting step performed to the encapsulant 120.

It should be noted that similar symbols will be used for the singulated components/structures after the singulation process or the dicing process. For example, the plurality of antenna devices 105 (labelled in FIG. 3E) may be a plurality of antenna devices 105 after the singulation process or the dicing process (labelled in FIG. 3F), the plurality of interposers 390 (labelled in FIG. 3E) may be a plurality of interposers 390 after the singulation process or the dicing process (labelled in FIG. 3F), the plurality of chips 110 (labelled in FIG. 3E) may be a plurality of chips 110 after the singulation process or the dicing process (labelled in FIG. 3F), the encapsulant 120 (labelled in FIG. 3E) may be a plurality of encapsulants 120 after the singulation process or the dicing process (labelled in FIG. 3F), the circuit layer 130 (labelled in FIG. 3E) may be a plurality of circuit layers 130 after the singulation process or the dicing process (labelled in FIG. 3F), the plurality of conductive connectors 140 (labelled in FIG. 3E) may be a plurality of conductive connectors 140 after the singulation process or the dicing process (labelled in FIG. 3F), and the like. Other singulated elements may be follow the same component symbol rules as described above and will not be described or specifically illustrated herein.

After the above manufacturing process is performed, an integrated antenna package structure 300 provided in the present embodiment is substantially formed. Referring to FIG. 1J and FIG. 3G, the integrated antenna package structure 300 of the present embodiment is similar to the integrated antenna package structure 100 of the first embodiment. In the embodiment, the integrated antenna package structure 300 further includes an interposer 390. The interposer 390 is disposed between the chip package 101 and the antenna device 105. The antenna layer 170 of the antenna device 105 is electrically connected to the conductive connector 140 by the interposer 390.

FIG. 4A to FIG. 4D is a schematic partial cross-sectional view of a partial manufacturing method of an integrated antenna package structure according to a fourth embodiment of the invention. FIG. 4E is a schematic partial cross-sectional view of an integrated antenna package structure according to a fourth embodiment of the invention. In the embodiment, the manufacturing method of the integrated antenna package structure 400 of the present embodiment is similar to the manufacturing method of the integrated antenna package structure 100 of the first embodiment, and similar elements are denoted by the same reference numerals, and have similar functions, materials, or formation modes, and the description is omitted.

Referring to FIG. 1D to FIG. 1F and FIG. 4A, the following steps may be performed by means similar to FIG. 1D to FIG. 1F: providing a first carrier 911; forming a circuit layer 130 on the first carrier 911; forming conductive connectors 140 on the circuit layer 130; disposing a chip 110 on the circuit layer 130; and forming an encapsulant 120 on the circuit layer 130, wherein the encapsulant 120 encapsulates the chip 110 and exposes the conductive connectors 140. After the encapsulant 120 is formed, the circuit layer 470 is formed on the encapsulant 120. The antenna layer 470 is electrically connected to the corresponding conductive connector 140.

In the embodiment, an insulating layer 471 may be formed on the encapsulant 120 before the antenna layer 470 is formed. The insulating layer 471 may have a plurality of insulating openings. The antenna layer 470 formed on the insulating layer 471 may be electrically connected to the conductive connector 140 by a conductive material within the insulating opening.

In the embodiment, after the antenna layer 470 is formed, an insulating layer 472 may be formed on the antenna layer 470. The insulating layer 472 may cover the antenna layer 470 and the insulating layer 471.

Figure 4A:
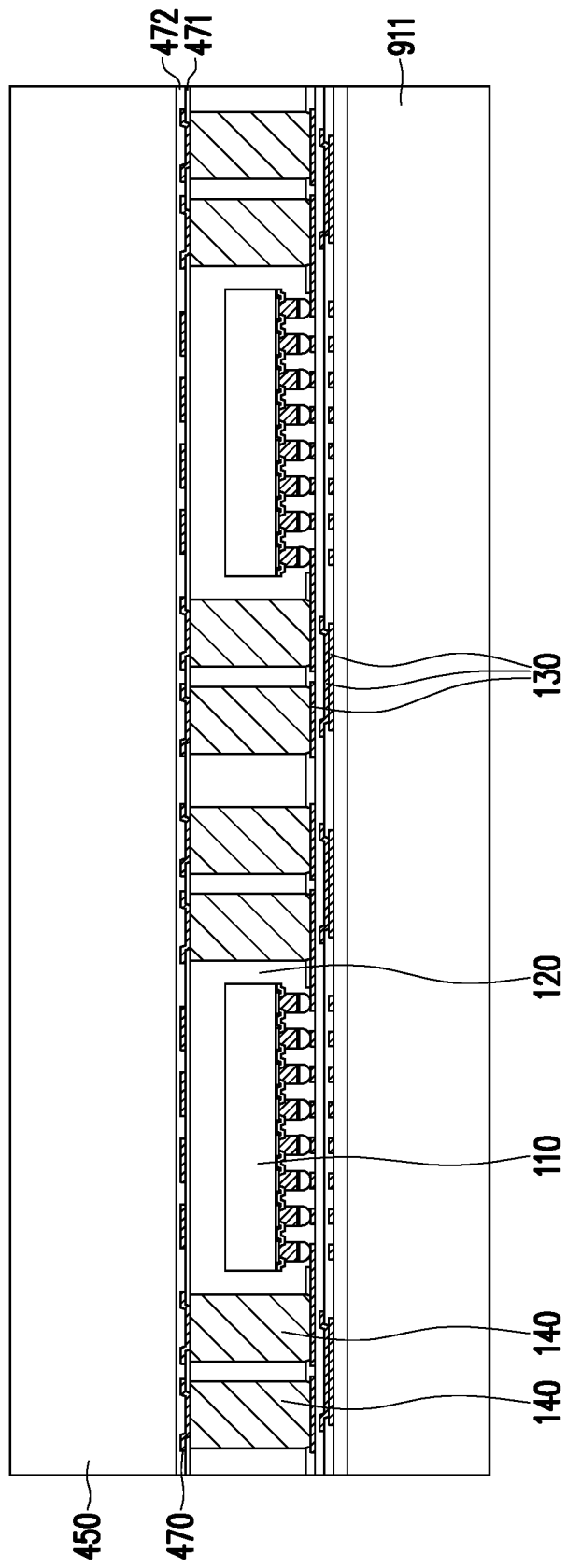
FIG. 4A to FIG. 4D is a schematic partial cross-sectional view of a partial manufacturing method of an integrated antenna package structure according to a fourth embodiment of the invention.

Referring to FIG. 4A, after the antenna layer 470 is formed, a dielectric body 450 is formed on the antenna layer 470.

In the embodiment, the material and formation manner of the dielectric body 450 may be the same as or similar to the material and formation manner of the encapsulant 120. For example, the material of the dielectric body 450 may include an epoxy or polyimide (PI) material, but the invention is not limited thereto.

Figure 4B:
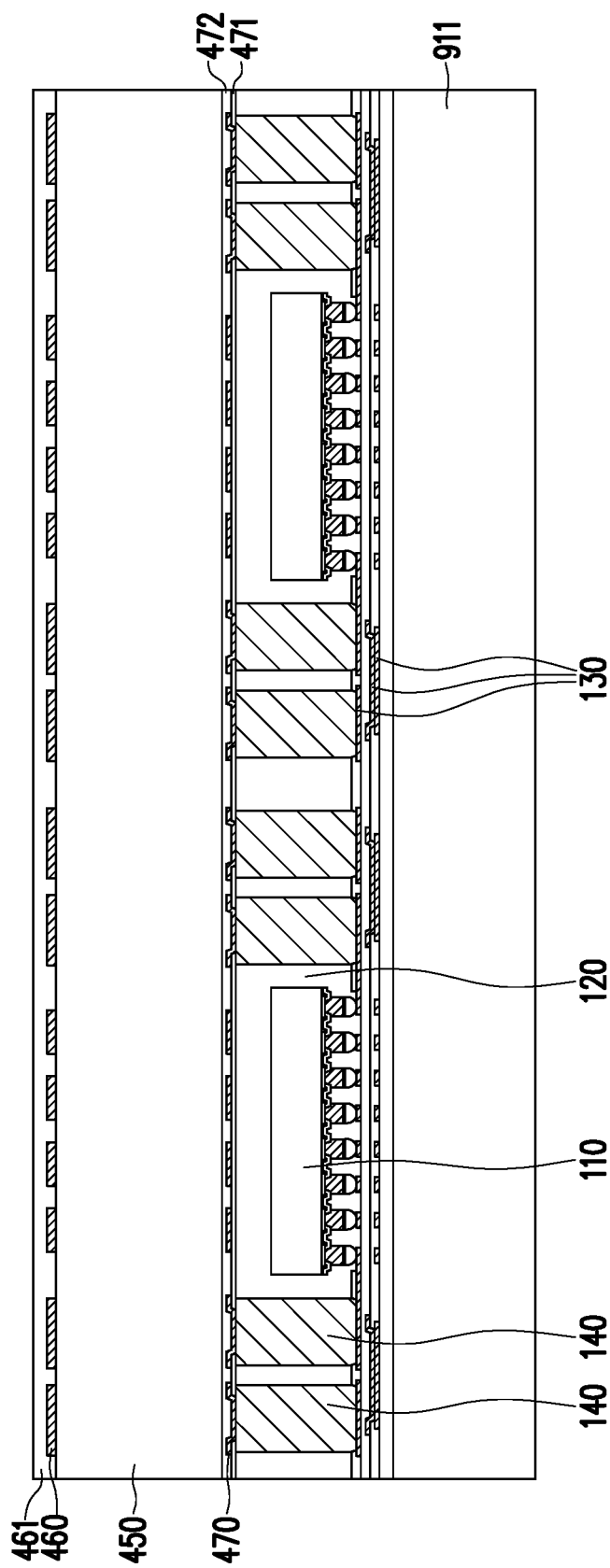

Referring to FIG. 4A to FIG. 4B, after the dielectric body 450 is formed, the coupling layer 460 may be formed on the dielectric body 450.

In the embodiment, a cover layer 461 may be formed on the coupling layer 460, but the invention is not limited thereto.

The insulating layer 471, the insulating opening of the insulating layer 471, the antenna layer 470, the insulating layer 472, the coupling layer 460, and the cover layer 461 may be formed by a general semiconductor process (such as a deposition process, a lithography process, and/or an electroplating process), and thus will not be described herein.

Figure 4C:
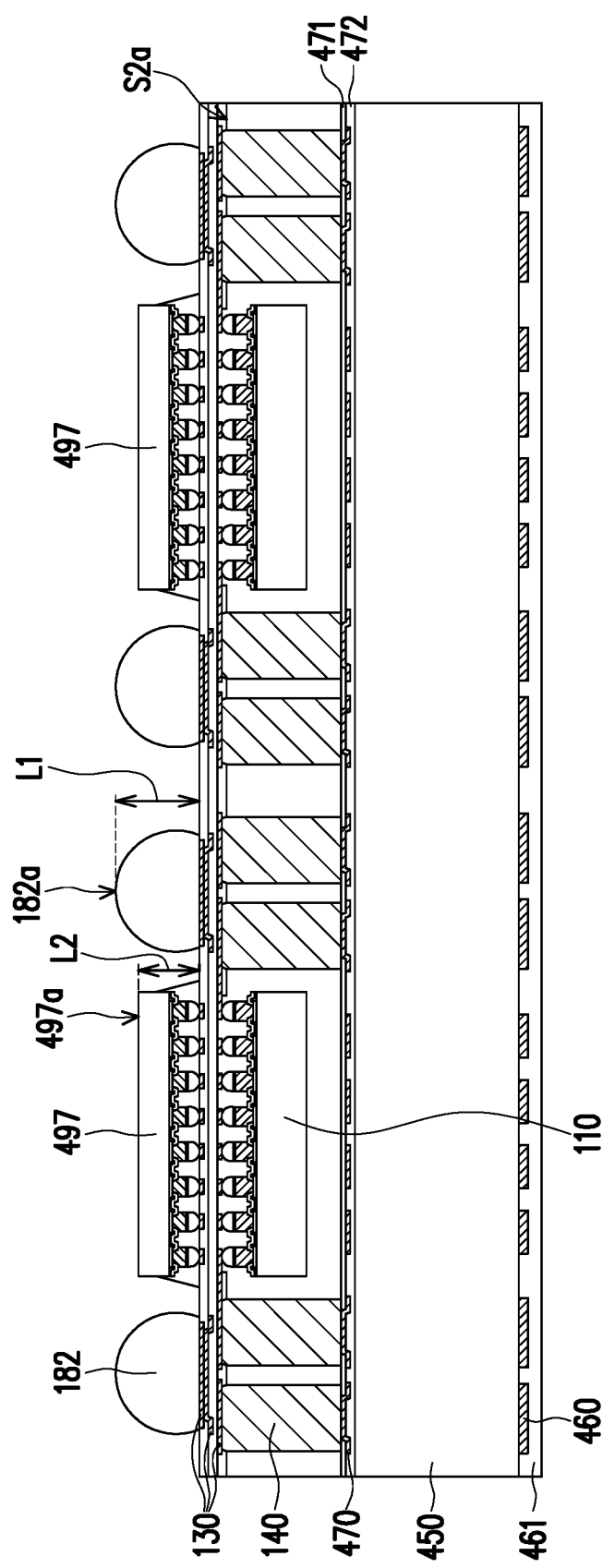

Referring to FIG. 4B to FIG. 4C, in the embodiment, after forming the coupling layer 460 and the film layer covering the coupling layer 460 (e.g., the cover layer 461, if any), the first carrier 911 may be removed.

In the embodiment, after the first carrier 911 is removed, a plurality of conductive terminals 182 may be formed.

In the embodiment, after the first carrier 911 is removed, a plurality of electronic devices 497 may be disposed on the first encapsulant surface S2a of the encapsulant 120. The electronic device is electrically connected to a corresponding circuit of the circuit layers 130. In the embodiment, the electronic device 497 may be a chip, but the invention is not limited thereto. In an embodiment not shown, the electronic device may be a passive component.

It should be noted that the order of forming the conductive terminal 182 and disposing the electronic device 497 is not limited in the embodiment. The shortest distance L2 between the top end 497a of the electronic device 497 and the plane in which the circuit layer 130 is located may be smaller than the shortest distance L1 between the top end 182a of the conductive terminal 182 and the plane in which the circuit layer 130 is located.

Figure 4D:
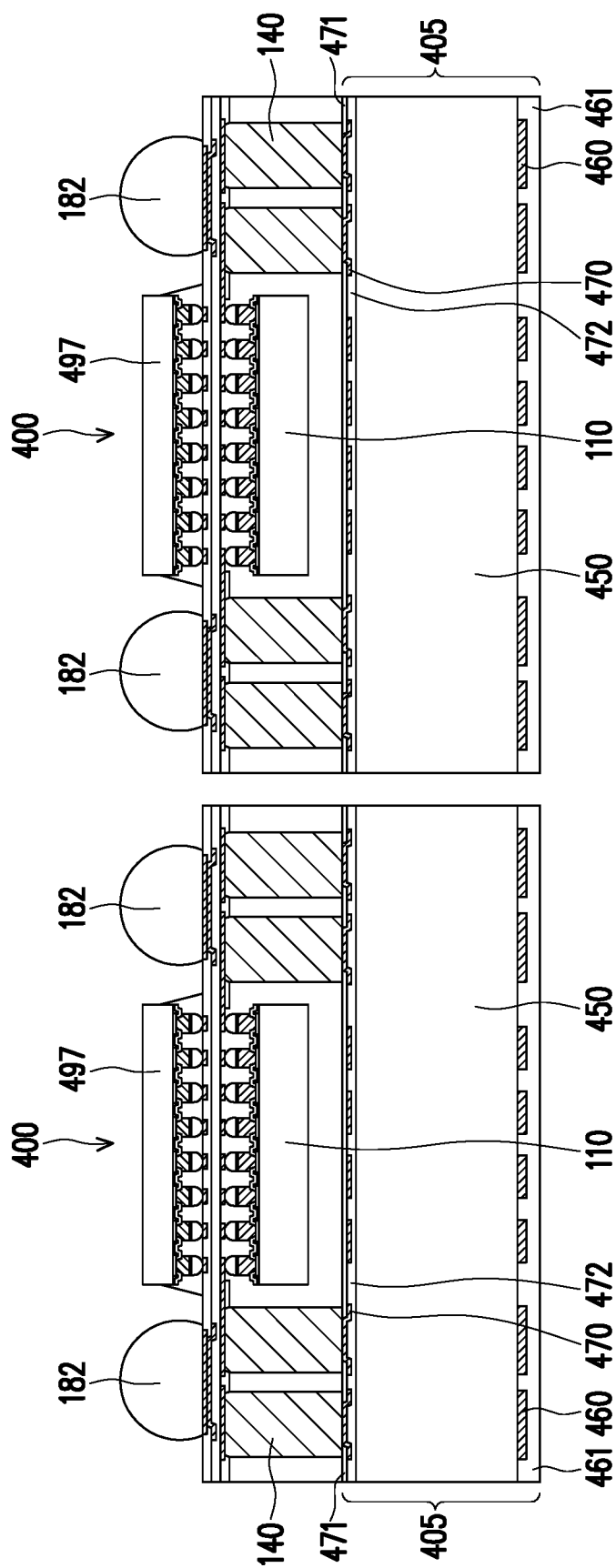
Figure 4E:
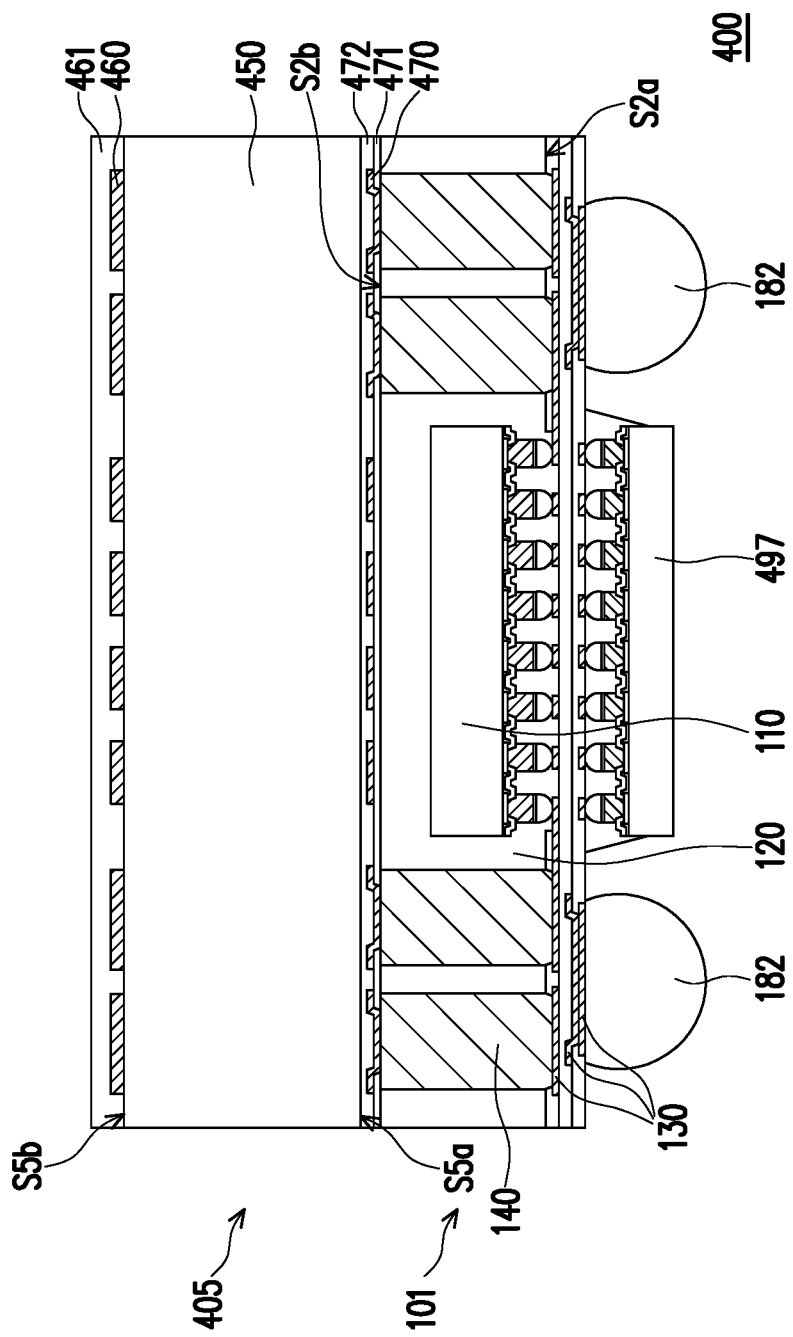
FIG. 4E is a schematic partial cross-sectional view of an integrated antenna package structure according to a fourth embodiment of the invention.

Referring to FIG. 4D, a singulation process or a dicing process may be performed to the structure as illustrated in FIG. 4C for forming a plurality of integrated antenna package structure 400. The singulation process or the dicing process may include a cutting step performed to the encapsulant 120 and the dielectric body 450.

It should be noted that similar symbols will be used for the singulated components/structures after the singulation process or the dicing process. For example, the insulating layer 471 (labelled in FIG. 4C) may be a plurality of insulating layers 471 after the singulation process or the dicing process (labelled in FIG. 4D), the antenna layer 470 (labelled in FIG. 4C) may be a plurality of antenna layers 470 after the singulation process or the dicing process (labelled in FIG. 4D), the insulating layer 472 (labelled in FIG. 4C) may be a plurality of insulating layers 472 after the singulation process or the dicing process (labelled in FIG. 4D), the dielectric body 450 (labelled in FIG. 4C) may be a plurality of dielectric bodies 450 after the singulation process or the dicing process (labelled in FIG. 4D), the coupling layer 460 (labelled in FIG. 4C) may be a plurality of coupling layers 460 after the singulation process or the dicing process (labelled in FIG. 4D), the cover layer 461 (labelled in FIG. 4C) may be a plurality of cover layers 461 after the singulation process or the dicing process (labelled in FIG. 4D), and the like. Other singulated elements may be follow the same component symbol rules as described above and will not be described or specifically illustrated herein.

The antenna layer 470, the insulating layer 471 covering a portion of the antenna layer 470, the dielectric body 450, and the coupling layer 460 after the singulation process or the dicing process may constitute an antenna device 405. That is, after the singulation process or the dicing process is performed, a plurality of antenna devices 405 may be formed. In other words, each of the antenna device 405 may include the corresponding antenna layer 470, the corresponding insulating layer 471, the corresponding dielectric body 450, and the corresponding coupling layer 460.

It should be noted that in the embodiment, after disposing a plurality of electronic devices 497, a singulation process or a dicing process for forming the plurality of chip packages 101 and the plurality of antenna devices 405 is performed. In an embodiment not shown, after performing a singulation process or a dicing process for forming the plurality of chip packages 101 and the plurality of antenna devices 405, a plurality of conductive terminals 182 may be disposed.

After the above manufacturing process is performed, an integrated antenna package structure 400 provided in the present embodiment is substantially formed. Referring to FIG. 4E, the integrated antenna package structure 400 of the present embodiment is similar to the integrated antenna package structure 100 of the first embodiment. In the embodiment, the integrated antenna package structure 400 includes a chip package 101 and an antenna device 405. The antenna device 405 includes a dielectric body 450, a coupling layer 460, an antenna layer 470, and an insulating layer 471. The dielectric body 450 has a first dielectric surface S5a and a second dielectric surface S5b. The second dielectric surface S5b is opposite to the first dielectric surface S5a. The coupling layer 460 is disposed on the second dielectric surface S5b of the dielectric body 450. The antenna layer 470 is disposed on the first dielectric surface S5a of the dielectric body 450. The antenna layer 470 is electrically connected to the conductive connector 140. The insulating layer 471 is disposed on the first dielectric surface S5a of the dielectric body 450. The insulating layer 471 at least covers a portion of the antenna layer 470. The insulating layer 471 of the antenna device 405 directly contacts the second encapsulant surface S2b of the encapsulant 120 of the chip package 101.

In the embodiment, the dielectric body 450 can be a homogeneous material, and the coupling layer 460 may directly contact the second dielectric surface S5b of the dielectric body 450.

In the embodiment, the integrated antenna package structure 400 may further include an electronic device 497 disposed on the first encapsulant surface S2a of the encapsulant 120, but the invention is not limited thereto.

FIG. 5A to FIG. 5G are schematic partial cross-sectional views of a partial manufacturing method of an integrated antenna package structure according to a fifth embodiment of the invention. FIG. 5H is a schematic partial cross-sectional view of an integrated antenna package structure according to a fifth embodiment of the invention. In the embodiment, the manufacturing method of the integrated antenna package structure 500 of the present embodiment is similar to the manufacturing method of the integrated antenna package structure 400 of the fourth embodiment, and similar elements are denoted by the same reference numerals, and have similar functions, materials, or formation modes, and the description is omitted. For example, in the embodiment, a partial manufacturing method of the integrated antenna package structure 400 may be the same or similar to the manufacturing method of the structure as shown in FIG. 4A.

Figure 5A:
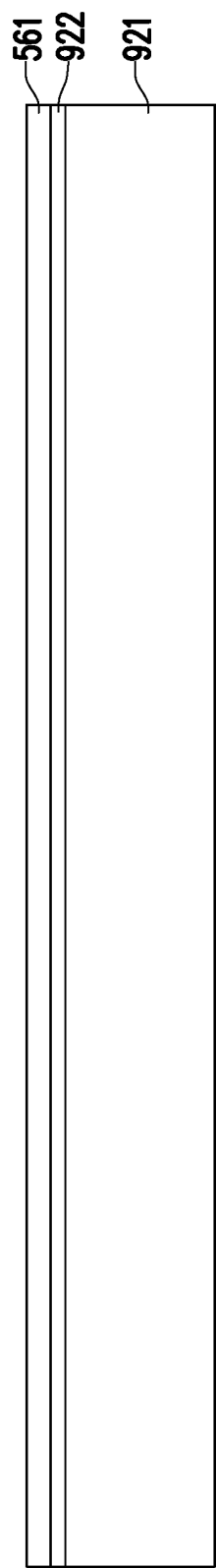
FIG. 5A to FIG. 5G are schematic partial cross-sectional views of a partial manufacturing method of an integrated antenna package structure according to a fifth embodiment of the invention.

Referring to FIG. 5A, a second carrier 921 is provided. In the embodiment, the second carrier 921 is not particularly limited as long as the second carrier 921 can be adapted to be carried an element/device disposed thereon or a film layer disposed thereon.

In the embodiment, a release film 922 may be disposed on the second carrier 921. In a subsequent process, the release film 922 may make the second carrier 921 easier to separate from the component/device or film layer disposed thereon.

Referring to FIG. 5A, a cover layer 561 is formed on the second carrier 921.

Figure 5B:
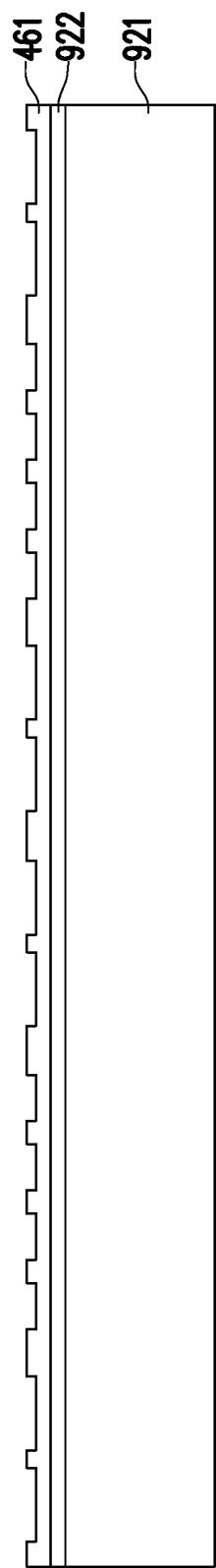

Referring to FIG. 5A to FIG. 5B, a protective layer 461 having a plurality of recesses is formed. For example, the recesses may be formed by laser drilling, laser peeling, or other similar multi-focus laser separation technology. The depth or pattern design of the recesses may have more variations via the laser technology.

Figure 5C:
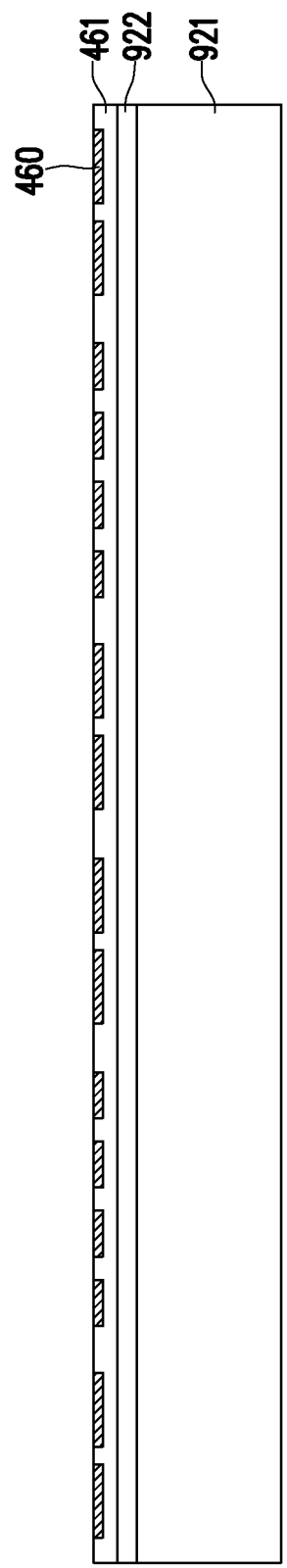

Referring to FIG. 5B to FIG. 5C, after forming the cover layer 461 having a plurality of recesses, a conductive material may be filled into the recesses of the cover layer 461 to form a coupling layer 460 on the second carrier 921.

Figure 5D:
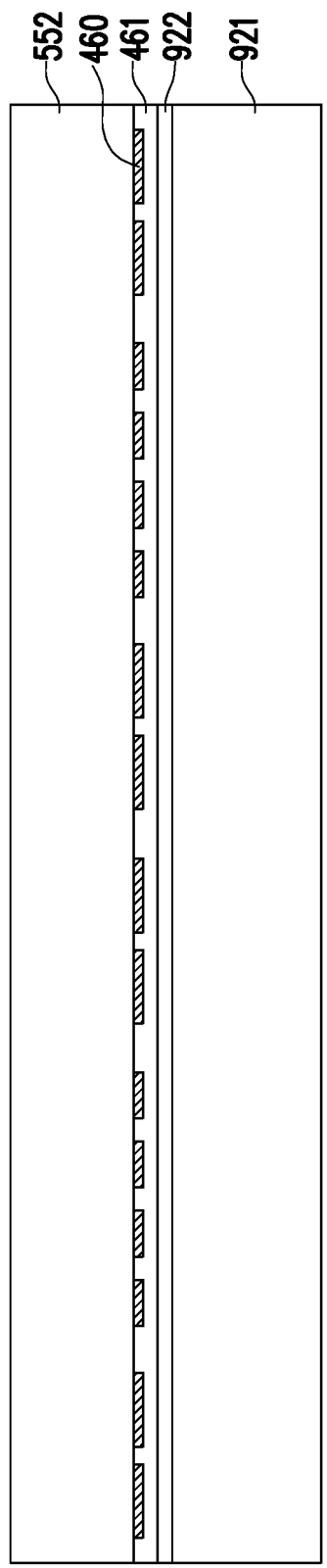

Referring to FIG. 5C to FIG. 5D, after the coupling layer 460 is formed, a dielectric body 552 may be formed on the coupling layer 460.

In the embodiment, the material and formation manner of the dielectric body 552 may be the same as or similar to the material and formation manner of the encapsulant 120. For example, the material of the dielectric body 552 may include a B-stage epoxy resin, a B-stage polyimide material, or other suitable B-stage materials, but the invention is not limited thereto.

In an embodiment, the dielectric constant (Dk) of the cured dielectric body 552 may be between 3 and 4, and the dissipation factor (Df) of the cured dielectric body 552 at a frequency commonly used in the general communication field can be less than or equal to 0.005, but the invention is not limited thereto.

Figure 5E:
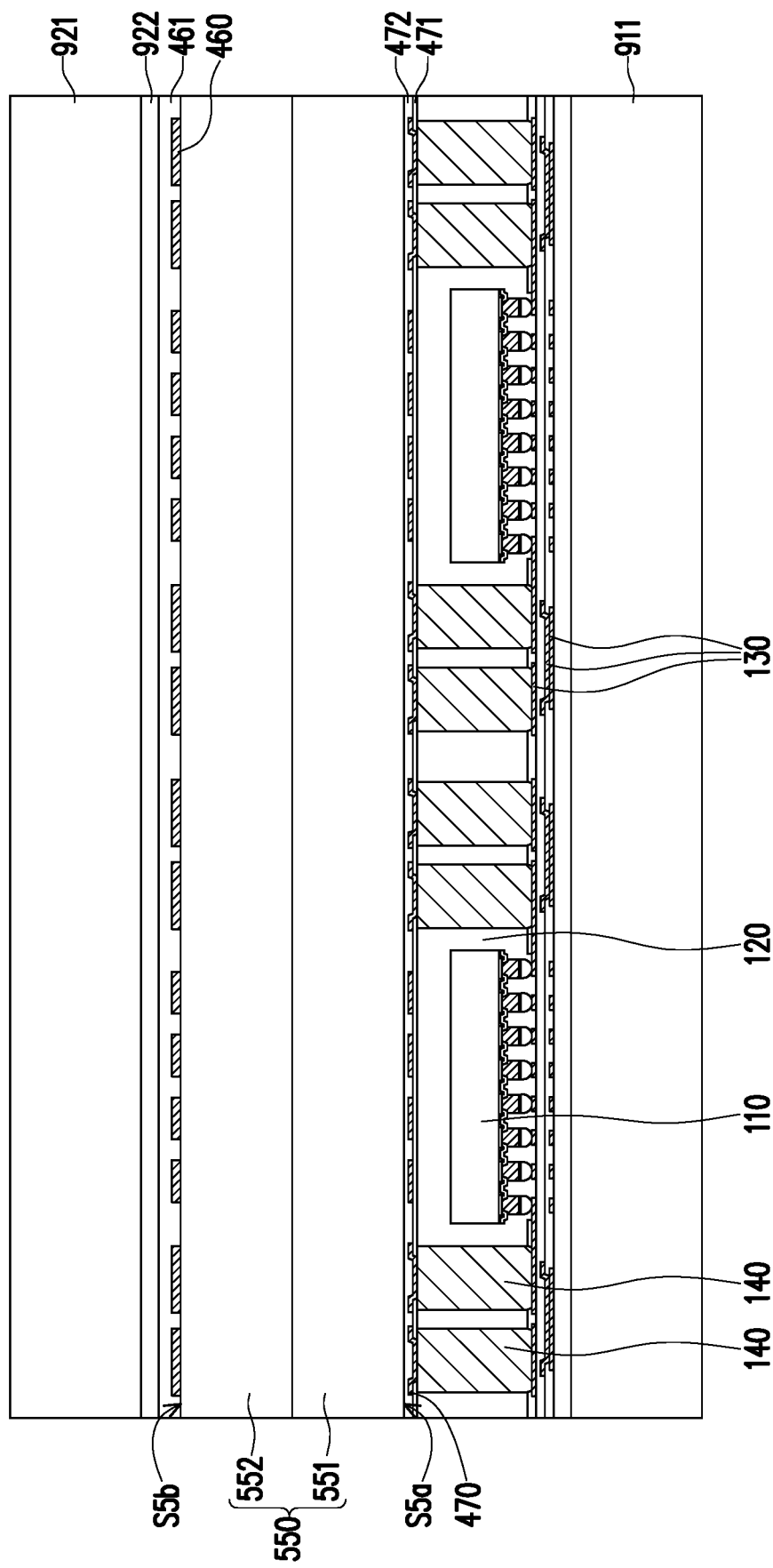

Referring to FIG. 4A, FIG. 5D and FIG. 5E, a structure similar to that shown in FIG. 4A and the structure shown in FIG. 5D may be combined to form the structure as shown in FIG. 5E.

For example, the dielectric body 551 (similar to the dielectric body 450 in the structure as shown in FIG. 4A) and/or the dielectric body 552 in the structure as shown in FIG. 5D may have an uncured state. Then, the dielectric body 551 in a structure similar to that as shown in FIG. 4A is in contact with the dielectric body 552 in the structure as shown in FIG. 5D in a face-to-face manner. Then, the dielectric body 551 and/or the dielectric body 552 are cured to form a bulk dielectric body 550.

In the dielectric body 550, the dielectric body 551 may be referred to as a first dielectric portion, and the dielectric body 552 may be referred to as a second dielectric portion. That is, the first dielectric surface S5a of the dielectric body 550 may be a partial surface of the dielectric body 551 (e.g., the first dielectric portion), and the second dielectric surface S5b of the dielectric body 550 may be a partial surface of the dielectric body 552 (e.g., the second dielectric portion).

In the embodiment, the material of the dielectric body 551 may be the same or different from the material of the dielectric body 552, and is not limited in the invention.

In an embodiment, the material of the dielectric body 551 may be different from the material of the dielectric body 552. For example, the Young's modulus of the dielectric body 551 (e.g., the first dielectric portion) may be greater than the Young's modulus of the dielectric body 552 (e.g., the second dielectric portion). As such, in the subsequent process, the warpage of the structure may be reduced.

Figure 5F:
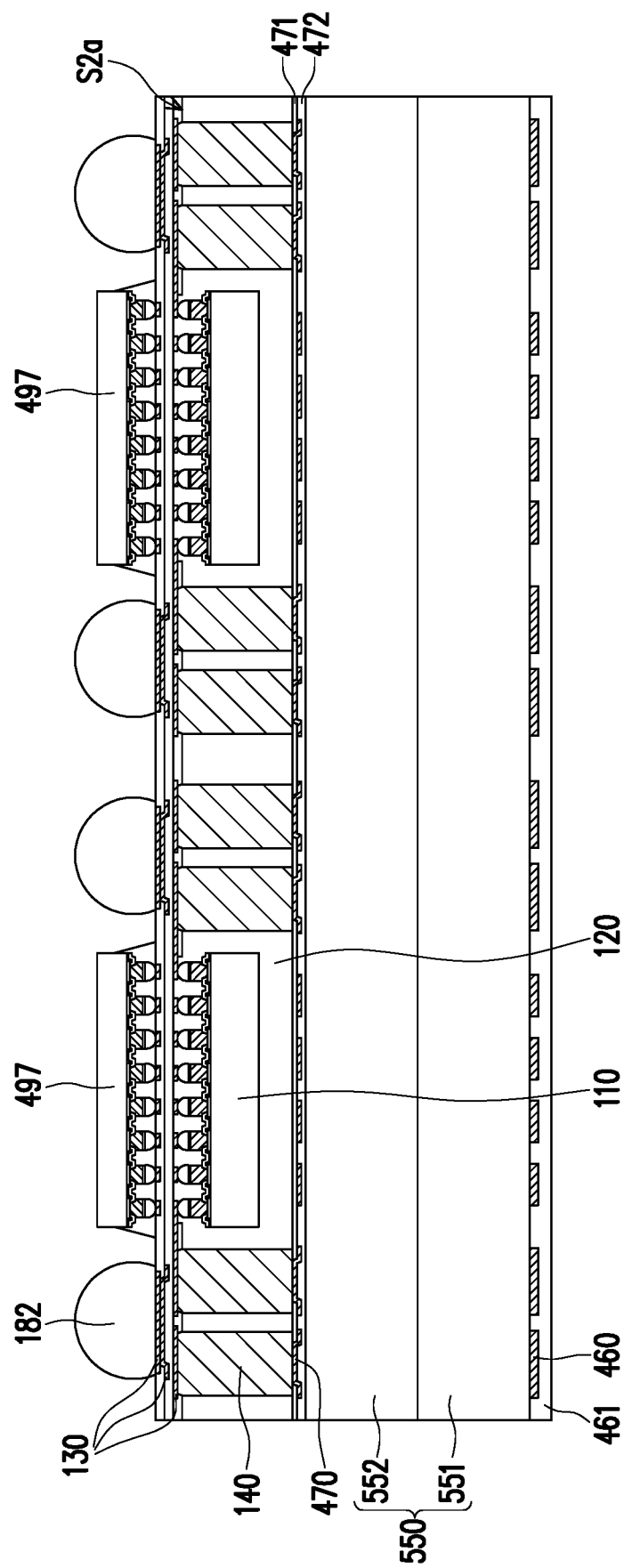

Referring to FIG. 5E to FIG. 5F, in the embodiment, after the dielectric body 550 is formed, the first carrier 911 may be removed.

In the embodiment, after the first carrier 911 is removed, a plurality of conductive terminals 182 may be formed.

In the embodiment, after the first carrier 911 is removed, a plurality of electronic devices 497 may be disposed on the first encapsulant surface S2a of the encapsulant 120.

Figure 5G:
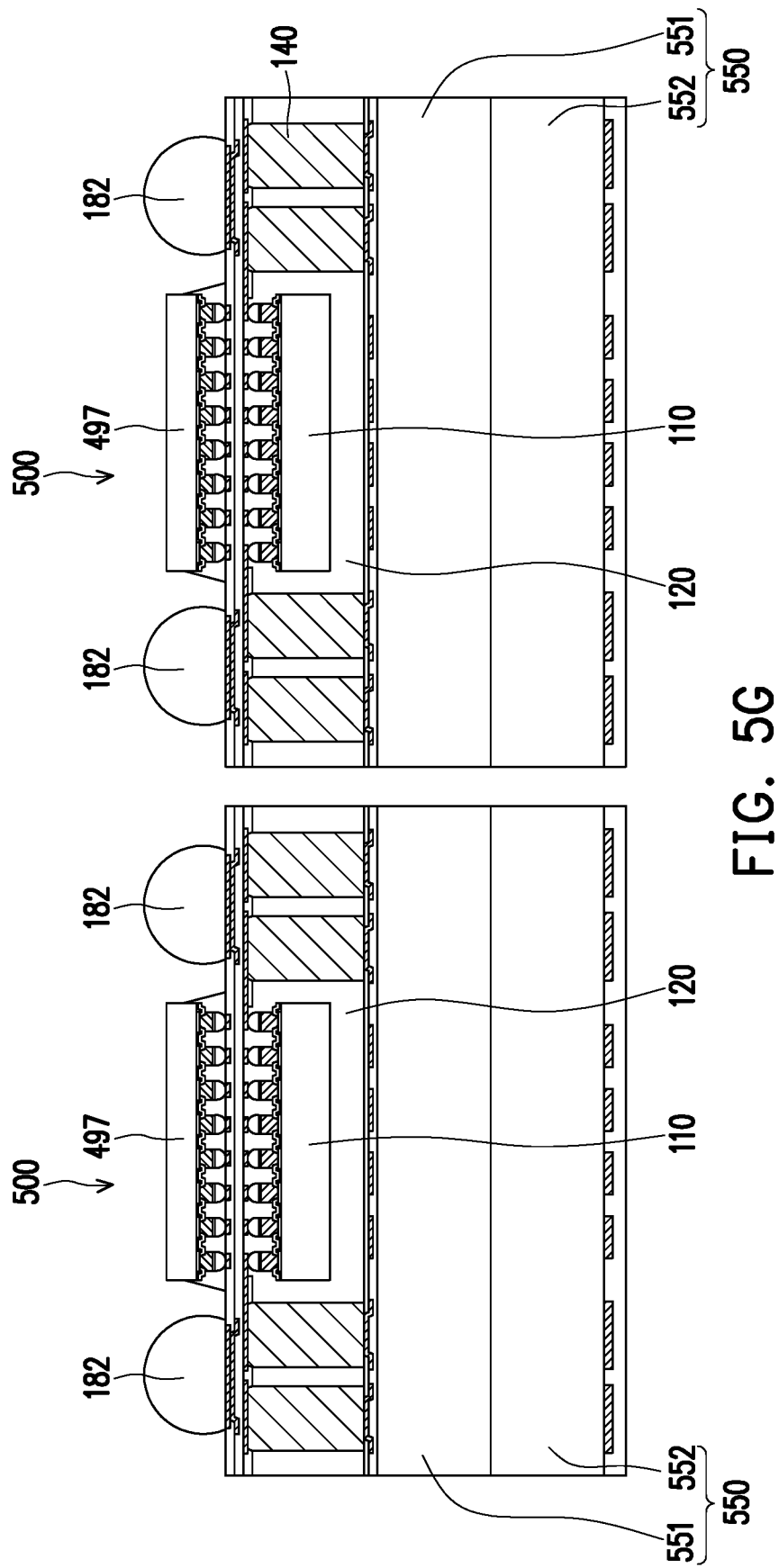
Figure 5H:
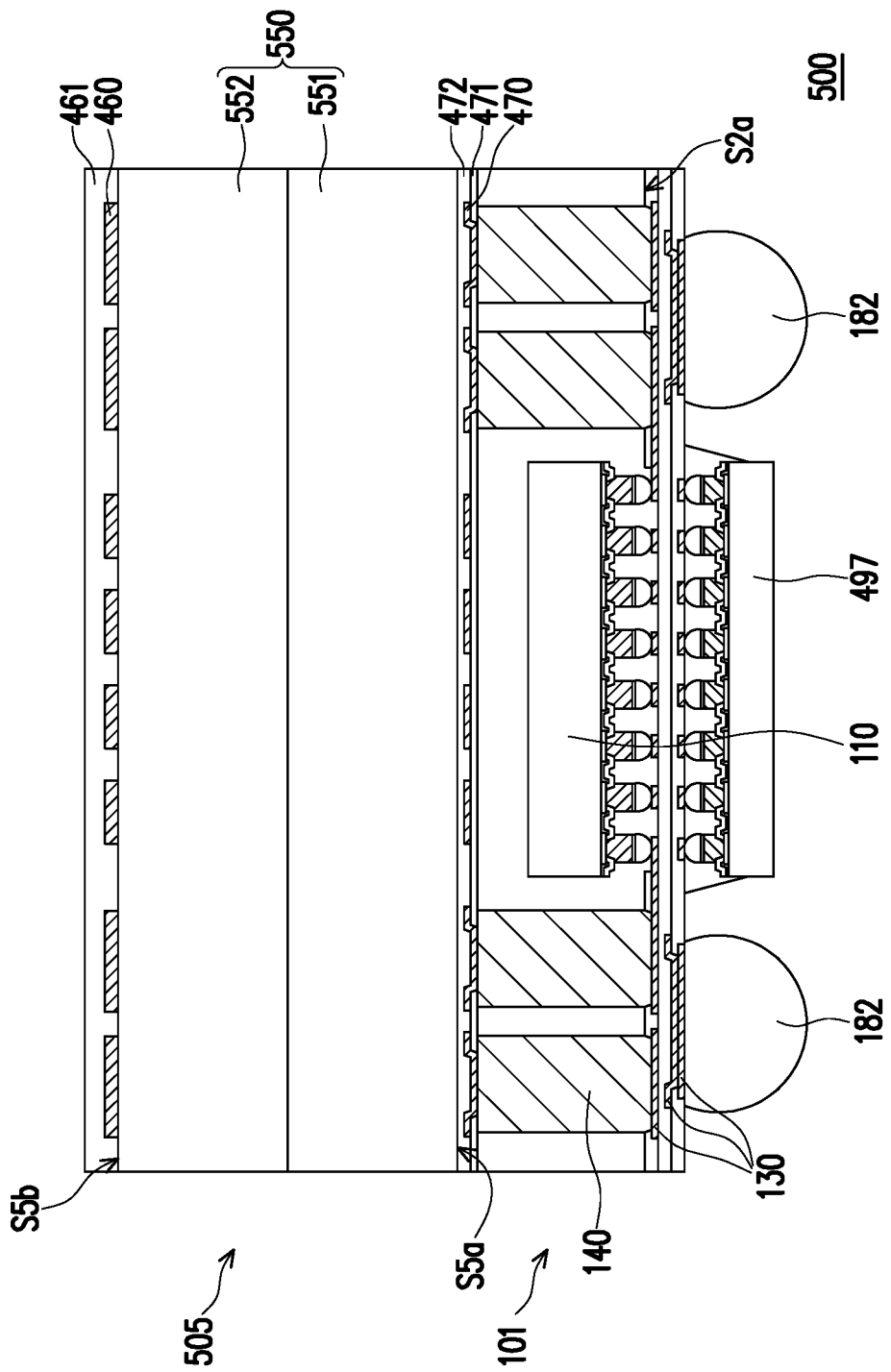
FIG. 5H is a schematic partial cross-sectional view of an integrated antenna package structure according to a fifth embodiment of the invention.

Referring to FIG. 5G, a singulation process or a dicing process may be performed to the structure as illustrated in FIG. 5F for forming a plurality of integrated antenna package structure 500. The singulation process or the dicing process may include a cutting step performed to the encapsulant 120 and the dielectric body 550.

It should be noted that similar symbols will be used for the singulated components/structures after the singulation process or the dicing process. For example, the dielectric body 550 (labelled in FIG. 5F) may be a plurality of dielectric bodies 550 after the singulation process or the dicing process (labelled in FIG. 5G), and the like. Other singulated elements may be follow the same component symbol rules as described above and will not be described or specifically illustrated herein.

The antenna layer 470, the insulating layer 471 covering a portion of the antenna layer 470, the dielectric body 550, and the coupling layer 460 after the singulation process or the dicing process may constitute an antenna device 505. That is, after the singulation process or the dicing process is performed, a plurality of antenna devices 505 may be formed. In other words, each of the antenna device 505 may include the corresponding antenna layer 470, the corresponding insulating layer 471, the corresponding dielectric body 550, and the corresponding coupling layer 460.

After the above manufacturing process is performed, an integrated antenna package structure 500 provided in the present embodiment is substantially formed. Referring to FIG. 5H, the integrated antenna package structure 500 of the present embodiment is similar to the integrated antenna package structure 400 of the fourth embodiment. In the embodiment, the integrated antenna package structure 500 includes a chip package 101 and an antenna device 505. The antenna device 505 includes a dielectric body 550, a coupling layer 460, an antenna layer 470, and an insulating layer 471. The dielectric body 550 includes a dielectric body 551 (e.g., a first dielectric portion) and a dielectric body 552 (e.g., a second dielectric portion). The dielectric body 550 has a first dielectric surface S5a and a second dielectric surface S5b. The second dielectric surface S5b is opposite to the first dielectric surface S5a. The coupling layer 460 is disposed on the second dielectric surface S5b of the dielectric body 550. The antenna layer 470 is disposed on the first dielectric surface S5a of the dielectric body 550. The insulating layer 471 is disposed on the first dielectric surface S5a of the dielectric body 550.

Figure 6:
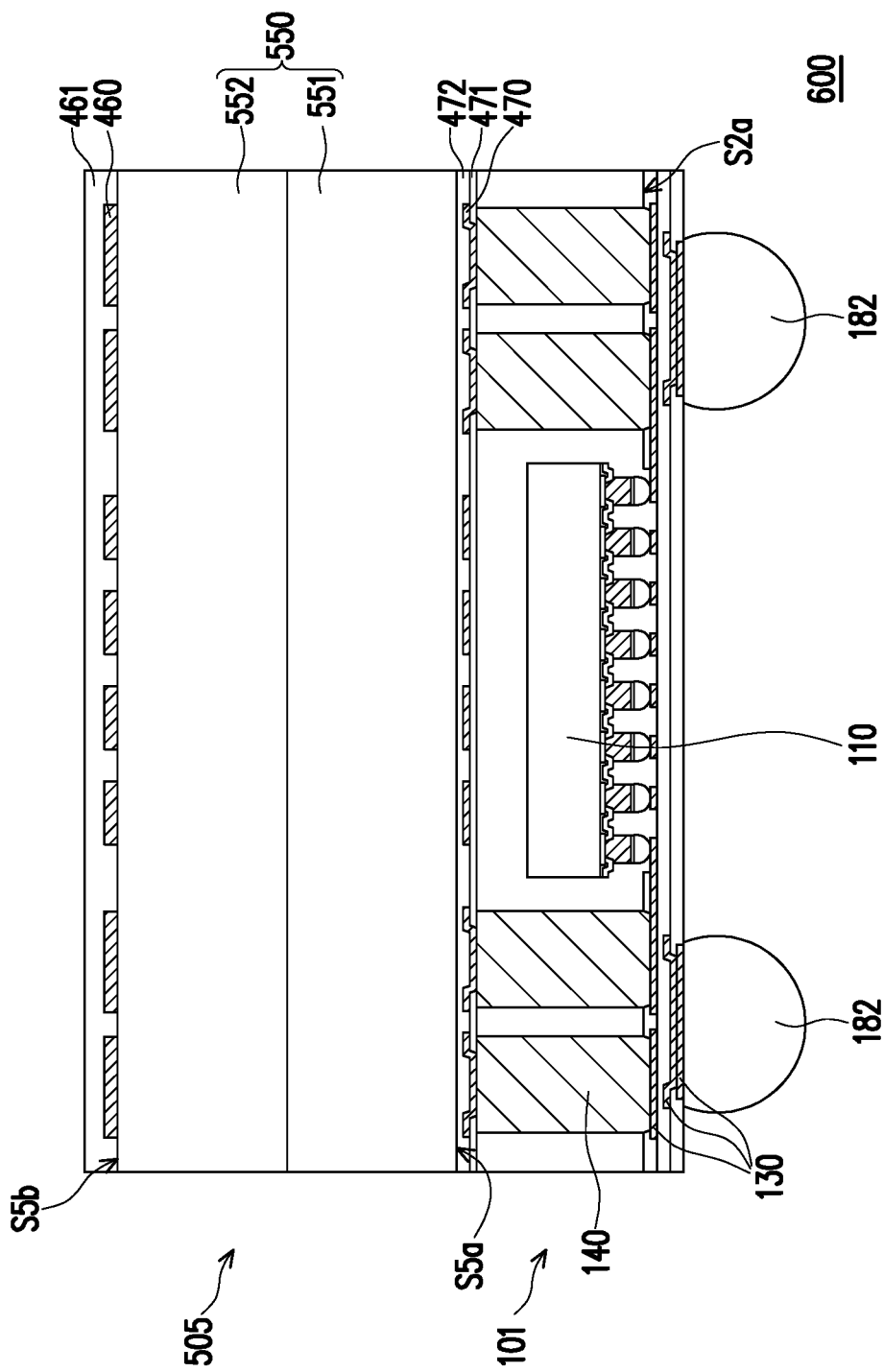
FIG. 6 is a schematic partial cross-sectional view of an integrated antenna package structure according to a sixth embodiment of the invention.

FIG. 6 is a schematic partial cross-sectional view of an integrated antenna package structure according to a sixth embodiment of the invention. Referring to FIG. 6, the integrated antenna package structure 600 of the present embodiment is similar to the integrated antenna package structure 500 of the fifth embodiment, and the difference is that the integrated antenna package structure 600 may have no electronic device similar to the aforementioned electronic device 497.

Figure 7A:
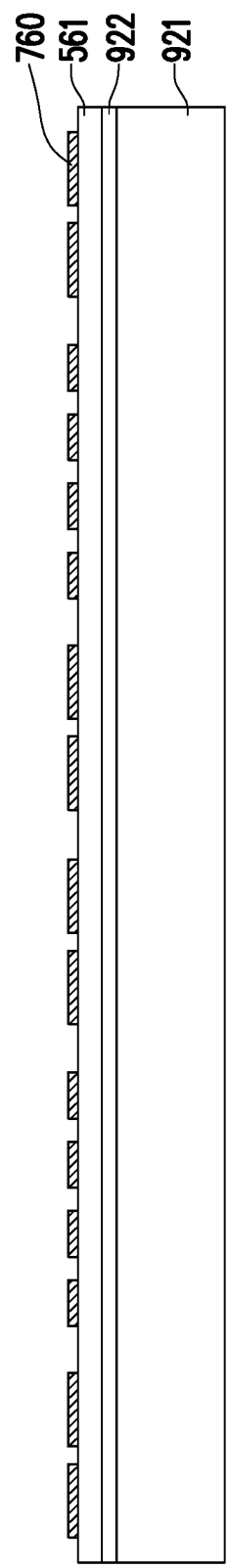
FIG. 7A to FIG. 7B are schematic partial cross-sectional views of a partial manufacturing method of an integrated antenna package structure according to a seventh embodiment of the invention.
Figure 7B:
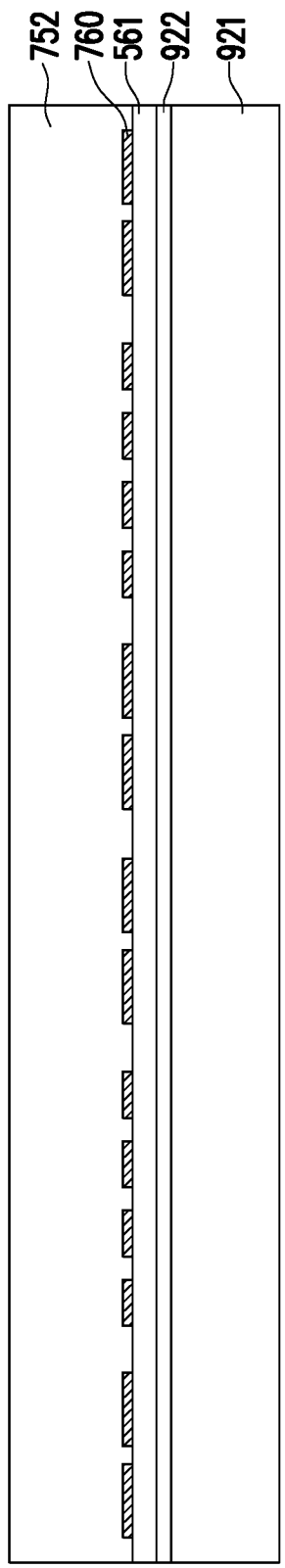
Figure 7C:
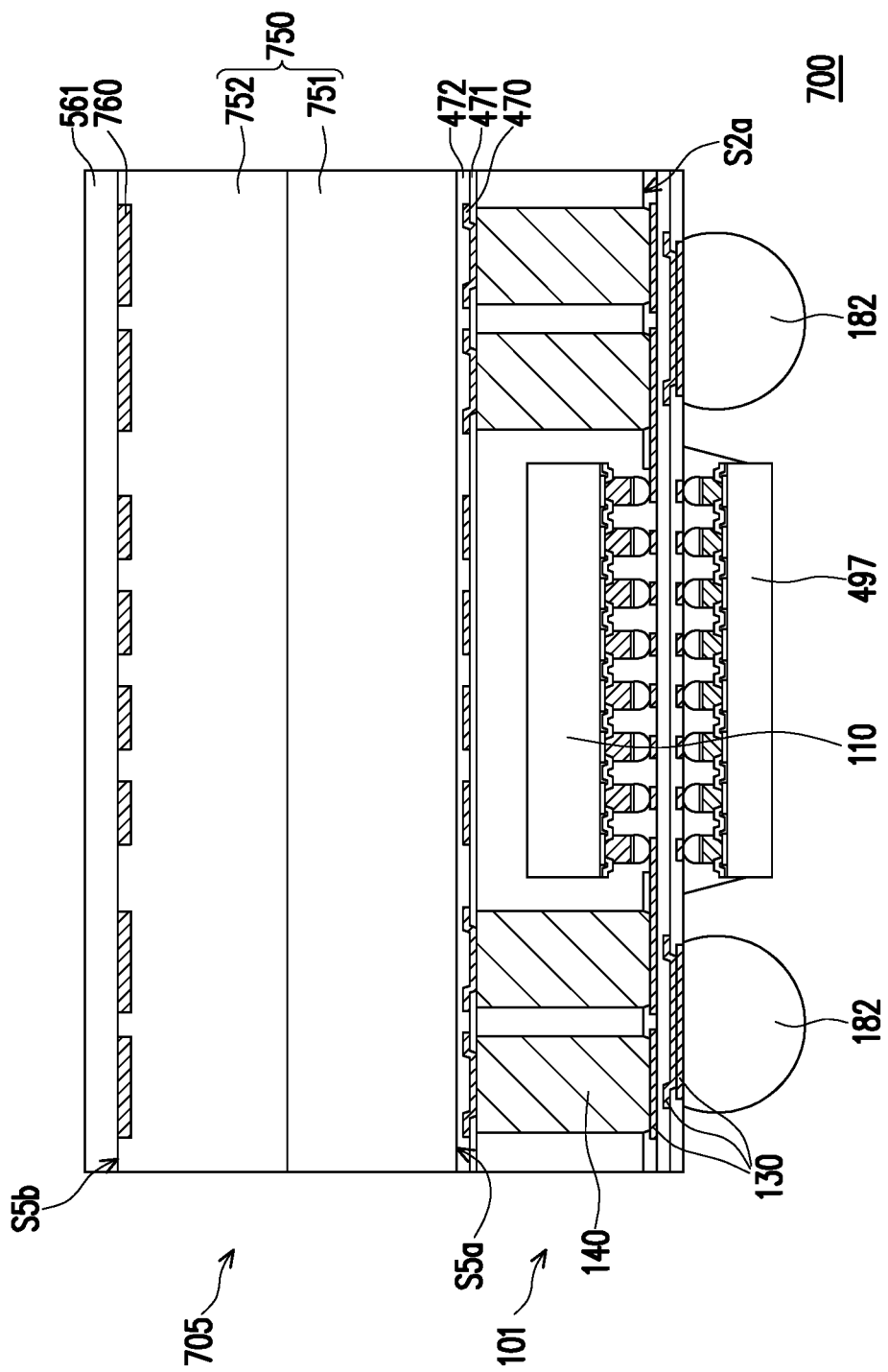
FIG. 7C is a schematic partial cross-sectional view of an integrated antenna package structure according to a seventh embodiment of the invention.

FIG. 7A to FIG. 7B are schematic partial cross-sectional views of a partial manufacturing method of an integrated antenna package structure according to a seventh embodiment of the invention. FIG. 7C is a schematic partial cross-sectional view of an integrated antenna package structure according to a seventh embodiment of the invention. In the embodiment, the manufacturing method of the integrated antenna package structure 700 of the present embodiment is similar to the manufacturing method of the integrated antenna package structure 500 of the fifth embodiment, and similar elements are denoted by the same reference numerals, and have similar functions, materials, or formation modes, and the description is omitted.

Referring to FIG. 7A, a second carrier 921 is provided. A cover layer 561 is formed on the second carrier 921. A coupling layer 760 is formed on the cover layer 561.

Referring to FIG. 7A to FIG. 7B, after the coupling layer 760 is formed, a dielectric body 752 is formed on the coupling layer 760.

In the embodiment, the material and formation manner of the dielectric body 752 may be the same as or similar to the material and formation manner of the dielectric body 552, and the dielectric body 752 further covers the sidewall of the coupling layer 760. In other words, the coupling layer 760 is embedded within the dielectric body 752.

Referring to FIG. 7B, FIG. 4A, FIG. 5E to FIG. 5G, and FIG. 7C, the structure as shown in FIG. 4A and the structure as shown in FIG. 7B may be combined. Thereafter, integrated antenna package structures 700 provided in the present embodiment may be substantially formed by steps similar to those illustrated or described in FIG. 5E to FIG. 5G.

Referring to FIG. 7C, the integrated antenna package structure 700 of the present embodiment is similar to the integrated antenna package structure 500 of the fifth embodiment. In the embodiment, the antenna device 705 of the integrated antenna package structure 700 includes a dielectric body 750, a coupling layer 760, an antenna layer 470, and an insulating layer 471. The dielectric body 750 includes a dielectric body 751 and a dielectric body 752. The dielectric body 751 is similar to the aforementioned dielectric body 551. The coupling layer 760 is embedded in the dielectric body 752.

In summary, the integrated antenna package structure a manufacturing method thereof may have a smaller volume and a higher yield.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An integrated antenna package structure comprising:
a chip package, comprising:
a chip;
an encapsulant, at least directly covering a back surface of the chip, wherein the encapsulant of the chip package has a first encapsulant surface and a second encapsulant surface opposite to the first encapsulant surface;
a circuit layer, disposed on the first encapsulant surface and electrically connected to the chip; and
a conductive connector, penetrating through the encapsulant and electrically connected to the circuit layer; and
an antenna device, disposed on the chip package, and the antenna device comprising:
a dielectric body, having a first dielectric surface and a second dielectric surface opposite to the first dielectric surface;
a coupling layer, disposed on the second dielectric surface of the dielectric body;
an antenna layer, disposed on the first dielectric surface of the dielectric body and electrically connected to the conductive connector;
a first insulating layer, disposed on and directly contacting the first dielectric surface of the dielectric body and covering a top surface and a side surface of the antenna layer; and
a second insulating layer, disposed under the first insulating layer, wherein the second insulating layer of the antenna device directly contacts the second encapsulant surface of the encapsulant of the chip package.

2. The integrated antenna package structure of claim 1, wherein:
the chip has an active surface, the back surface opposite to the active surface, and a side surface connecting the active surface and the back surface;
the active surface of the chip faces the circuit layer; and
the encapsulant directly and completely covers the back surface and the side surface of the chip.

3. The integrated antenna package structure of claim 1, wherein:
the chip has an active surface and the back surface opposite to the active surface;
the active surface of the chip faces the circuit layer; and
a portion of the encapsulant is disposed between the chip and the circuit layer.

4. The integrated antenna package structure of claim 1, wherein the antenna device further comprises:
an insulating layer, disposed on the first dielectric surface of the dielectric body and at least covering a portion of the antenna layer; and
a contact terminal, disposed on the first dielectric surface of the dielectric body, and the antenna layer is electrically connected to the conductive connector by the contact terminal.

5. The integrated antenna package structure of claim 1, wherein:
the dielectric body is a homogeneous material; and
the coupling layer directly contacts the second dielectric surface of the dielectric body, or the antenna layer directly contacts the first dielectric surface of the dielectric body.

6. The integrated antenna package structure of claim 1, wherein:
the dielectric body includes a first dielectric portion and a second dielectric portion;
the first dielectric surface of the dielectric body is a partial surface of the first dielectric portion;
the second dielectric surface of the dielectric body is a partial surface of the second dielectric portion; and
the Young's modulus of the first dielectric portion is greater than the Young's modulus of the second dielectric portion.

7. The integrated antenna package structure of claim 1, wherein the coupling layer is embedded in the dielectric body.

8. The integrated antenna package structure of claim 1, further comprising:
an interposer, disposed between the chip package and the antenna device, and the antenna layer of the antenna device is electrically connected to the conductive connector by the interposer.

* * * * *